US012345908B2

(12) United States Patent
Haag et al.

(10) Patent No.: US 12,345,908 B2
(45) Date of Patent: Jul. 1, 2025

(54) REFLECTIVE POLARIZER AND DISPLAY SYSTEM

(71) Applicant: 3M INNOVATIVE PROPERTIES COMPANY, St. Paul, MN (US)

(72) Inventors: Adam D. Haag, Woodbury, MN (US); Martin E. Denker, Vadnais Heights, MN (US); Timothy J. Nevitt, Red Wing, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 571 days.

(21) Appl. No.: 17/779,413

(22) PCT Filed: Dec. 8, 2020

(86) PCT No.: PCT/IB2020/061650
§ 371 (c)(1),
(2) Date: May 24, 2022

(87) PCT Pub. No.: WO2021/124018
PCT Pub. Date: Jun. 24, 2021

(65) Prior Publication Data
US 2022/0413198 A1    Dec. 29, 2022

Related U.S. Application Data

(60) Provisional application No. 62/950,646, filed on Dec. 19, 2019.

(51) Int. Cl.
*G02B 5/30* (2006.01)
*H10K 50/86* (2023.01)
*H10K 59/35* (2023.01)

(52) U.S. Cl.
CPC ......... *G02B 5/3025* (2013.01); *H10K 50/865* (2023.02); *H10K 59/35* (2023.02)

(58) Field of Classification Search
CPC .... G02B 5/3025; G02B 5/305; H10K 50/865; H10K 59/35; H10K 59/8791; G09F 9/335
See application file for complete search history.

(56) References Cited

U.S. PATENT DOCUMENTS

| 5,882,774 A | 3/1999 | Jonza et al. |
| 6,179,948 B1 | 1/2001 | Merrill et al. |

(Continued)

FOREIGN PATENT DOCUMENTS

| JP | 2004309618 | 11/2004 |
| JP | 2008197224 | 8/2008 |

(Continued)

OTHER PUBLICATIONS

Denker, "Advanced Polarizer Film for Improved Performance of Liquid Crystal Displays," Society for Information Displays (SID) International Conference in San Francisco Calif Jun. 4-9, 2006, SID International Symposium Digest of technical papers, 2006, vol. 37, No. 1, pp. 1528-1530.

International Search Report for PCT International Application No. PCT/IB2020/061650, mailed on Feb. 2, 2021, 3 pages.

*Primary Examiner* — Charles S Chang
(74) *Attorney, Agent, or Firm* — Clifton F. Richardson

(57) ABSTRACT

A display system includes a display panel including a plurality light emitting pixels and a reflective polarizer disposed on the light emitting pixels. The reflective polarizer can have a reflection band having a lower overlap with an emission spectrum of red light emitting pixels for substantially normally incident light and a higher overlap with the emission spectrum of the red light emitting pixels for at least one incident angle greater than about 40 degrees. The reflective polarizer can have a reflection band overlapping an emission spectrum of blue light emitting pixels for substantially normally incident light.

20 Claims, 35 Drawing Sheets

(56) References Cited

U.S. PATENT DOCUMENTS

| | | |
|---|---|---|
| 6,300,991 B1 | 10/2001 | Schadt et al. |
| 6,783,349 B2 | 8/2004 | Neavin et al. |
| 6,967,778 B1 | 11/2005 | Wheatley et al. |
| 8,969,857 B2 | 3/2015 | Kim et al. |
| 9,162,406 B2 | 10/2015 | Neavin et al. |
| 9,773,847 B2 | 9/2017 | Epstein et al. |
| 10,185,068 B2 | 1/2019 | Johnson et al. |
| 2002/0180916 A1 | 12/2002 | Schadt et al. |
| 2003/0028048 A1 | 2/2003 | Cherkaoui et al. |
| 2005/0072959 A1 | 4/2005 | Moia et al. |
| 2006/0197068 A1 | 9/2006 | Schadt et al. |
| 2016/0118448 A1 | 4/2016 | Epstein et al. |
| 2019/0346605 A1* | 11/2019 | Nevitt .................... B32B 7/023 |

FOREIGN PATENT DOCUMENTS

| | | |
|---|---|---|
| KR | 100507777 B1 | 8/2005 |
| KR | 100508526 | 8/2005 |
| KR | 100529050 | 11/2005 |
| KR | 100549853 | 2/2006 |
| KR | 20150039300 | 4/2015 |
| KR | 20150101106 | 9/2015 |
| WO | 2014197539 | 12/2014 |
| WO | 2018181634 | 10/2018 |
| WO | 2019069214 | 4/2019 |
| WO | 2020051874 | 3/2020 |
| WO | 2021059191 | 4/2021 |

\* cited by examiner

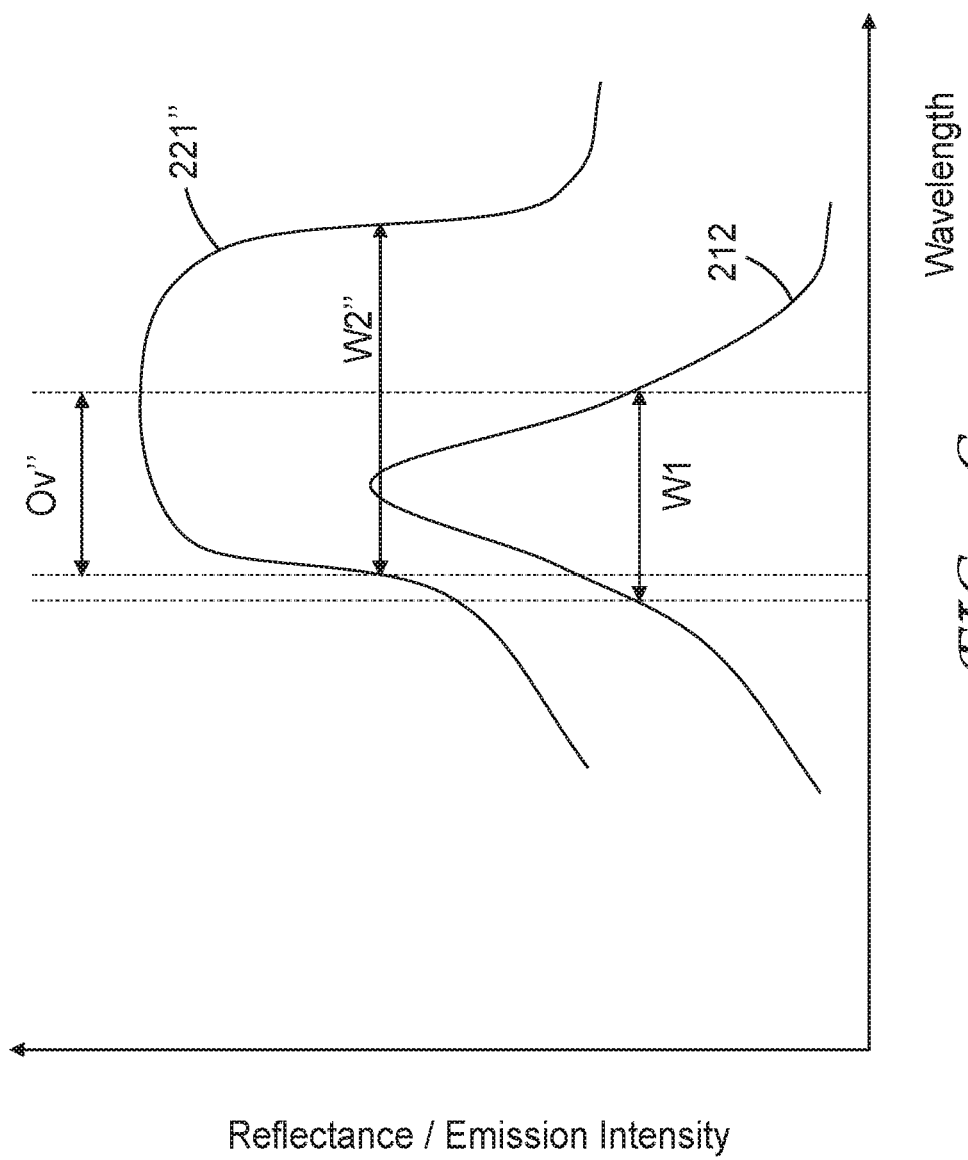

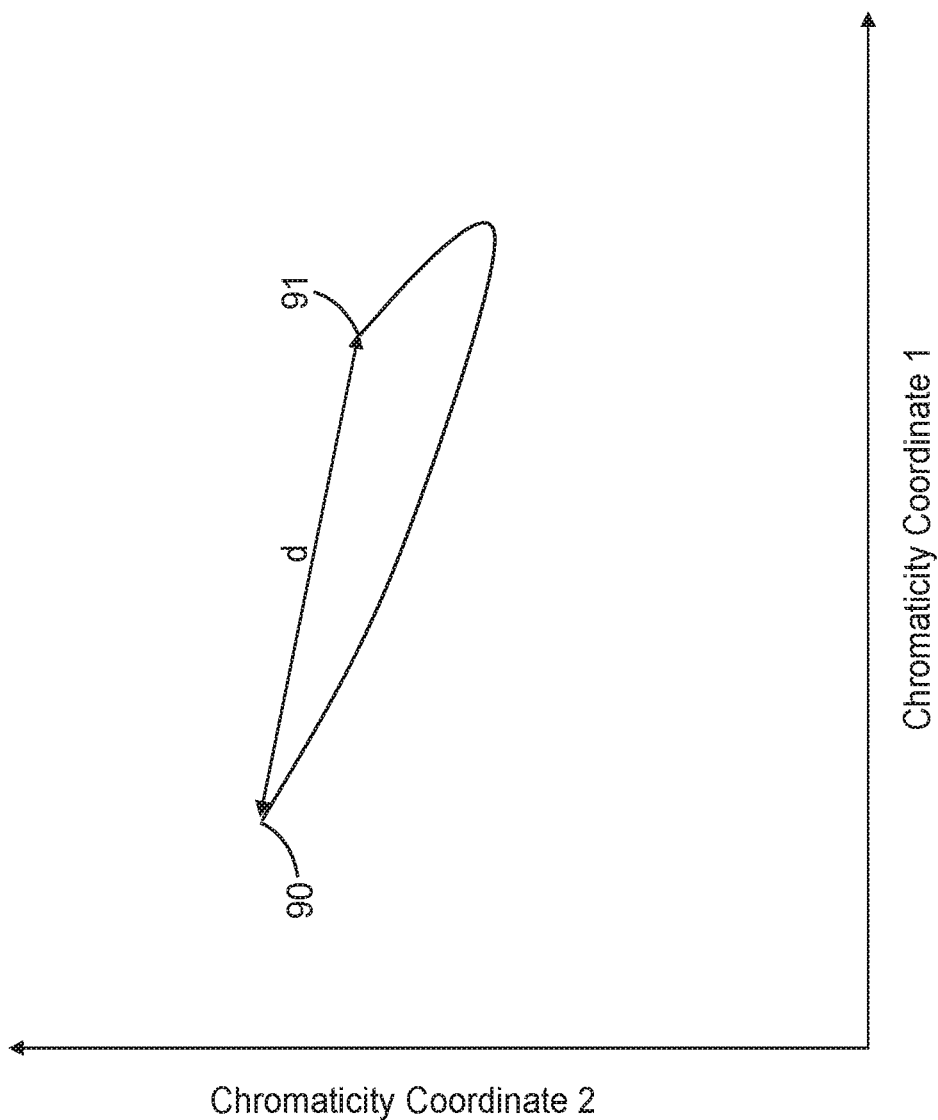

REFLECTIVE POLARIZER AND DISPLAY SYSTEM

CROSS REFERENCE TO RELATED APPLICATIONS

This application is a national stage filing under 35 U.S.C. 371 of PCT/IB2020/061650, filed Dec. 8, 2020, which claims the benefit of Provisional Application No. 62/950,646, filed Dec. 19, 2019, the disclosures of which are incorporated by reference in their entirety herein.

BACKGROUND

Organic light emitting diode (OLED) displays typically include a circular polarizer to reduce reflection of ambient light from the display.

SUMMARY

The present description relates to reflective polarizers and display systems. A display system can include a display panel including a plurality light emitting pixels and a reflective polarizer which can be disposed on the light emitting pixels. The reflective polarizer can increase a light output of the display system by recycling light that would otherwise be absorbed by an absorbing polarizer, for example. A reflective polarizer can have a reflection spectrum including substantially distinct blue, green, and infrared reflection bands. A reflective polarizer can have a reflection band (e.g., an infrared reflection band) having a lower overlap with an emission spectrum of red light emitting pixels for substantially normally incident light and a higher overlap with the emission spectrum of the red light emitting pixels for at least one incident angle greater than about 40 degrees. For example, in some embodiments, a reflective polarizer has a reflection band at least partially in the near infrared at normal incidence that shifts into the red at higher angles of incidence to increase recycling in the red. The reflective polarizer can have a reflection band overlapping an emission spectrum of blue light emitting pixels for substantially normally incident light. For example, the reflection band can have a higher reflectance in the blue than in the green at normal incidence such that at higher angles of incidence the shift in the reflection band results in reduced reflectance in the blue which reduces recycling in the blue. According to some embodiments, the reflective polarizer can provide lower white point color shift of light emitted from a display system than from display systems incorporating conventional notch reflective polarizers while providing lower ghosting and/or lower ambient reflection than display systems using broadband reflective polarizers.

These and other aspects will be apparent from the following detailed description. In no event, however, should this brief summary be construed to limit the claimable subject matter.

BRIEF DESCRIPTION OF THE DRAWINGS

FIGS. 5A-5C are schematic plots of a reflection band of a reflective polarizer and of an emission spectrum of a pixel;

FIG. 13A is a schematic plot of color shift of light exiting a display system on a chromaticity diagram;

DETAILED DESCRIPTION

Figure 1:
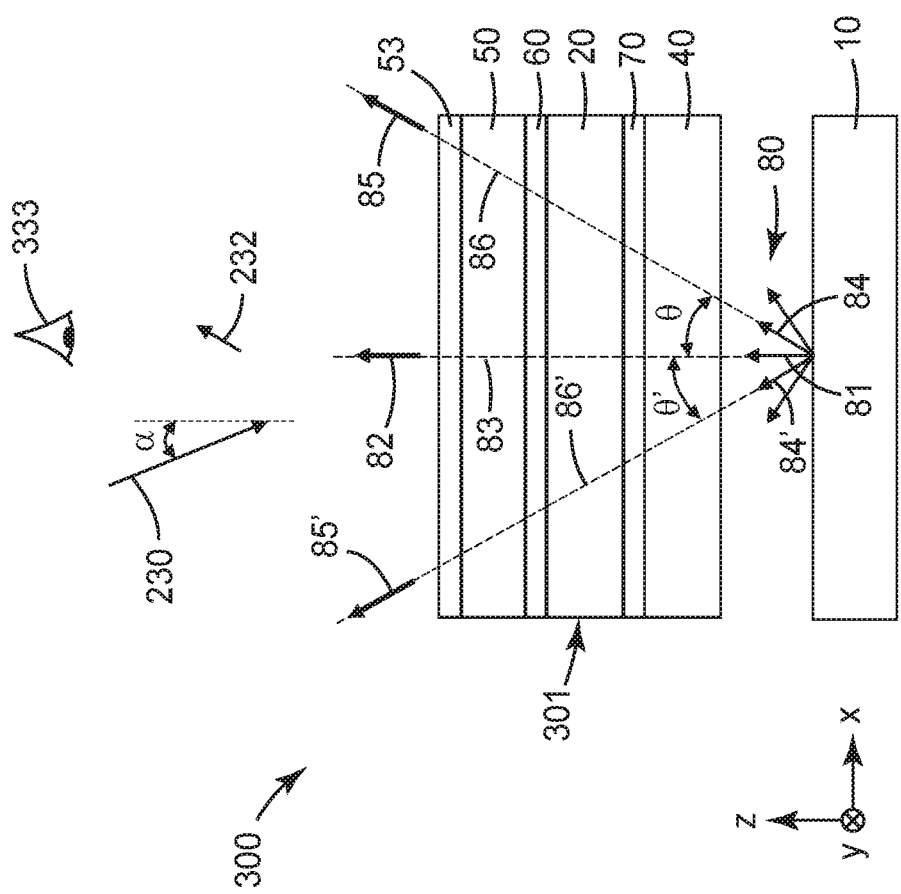
FIG. 1 is a schematic cross-sectional view of a display system.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

It has been found that the reflective polarizers described herein, according to some embodiments, are useful for improving performance of a display system when the reflective polarizer is disposed to receive a light output of the display. For example, in some embodiments, the reflective polarizer can be used in a circular polarizer disposed on an organic light emitting diode (OLED) display, or other emissive display, to improve the brightness of the display and/or the color gamut of the display without causing ghosting or other image degradations. Utilizing a broadband reflective polarizer in the circular polarizer of an OLED display for increasing the brightness of the display due to light recycling is described in U.S. Pat. No. 9,773,847 (Epstein et al.). As described in International Pat. Appl. No. CN2018/105712 (Xu et al.), it has been found that utilizing a notch reflective polarizer having band edges in the visible spectrum can increase the brightness and/or the color gamut of the display while producing substantially less or substantially no ghosting compared to using a broadband reflective polarizer and/or producing a reduced reflection of ambient light compared to using a broadband reflective polarizer. However, it has been found that using a notch reflective polarizer can result in an increased color shift of ambient reflected light and/or of light emitted from the display. According to some embodiments of the present description, the reflective polarizer has a reflection spectrum selected such that a white light output has a low color shift with changing view angle (e.g., as compared to using conventional notch reflective polarizers; or as compared to using broadband reflective polarizers; or as compared to omitting the reflective polarizer). It has been found that this can be achieved, for example, by including a reflection band in the near infrared at normal incidence that shifts into the red at higher angles of incidence to increase recycling in the red and/or using a reflection band having a higher reflectance in the blue than in the green at normal incidence such that at higher angles of incidence the shift in the reflection band results in reduced reflectance in the blue which reduces recycling in the blue. According to some embodiments, the reflective polarizer can provide lower white point color shift of light emitted from a display system than from display systems incorporating conventional notch reflective polarizers while providing lower ghosting and/or lower ambient reflection than display systems using broadband reflective polarizers.

The reflective polarizer can have a reflection band having a lower overlap (e.g., no overlap) with an emission spectrum of red light emitting pixels for substantially normally incident light and a higher overlap with the emission spectrum of the red light emitting pixels for at least one incident angle greater than about 40 degrees or greater than about 50 degrees. The reflective polarizer can have a reflection band overlapping an emission spectrum of blue light emitting pixels for substantially normally incident light. The reflection band can have a higher overlap with the emission spectrum of the blue light emitting pixels for substantially normally incident light and a lower overlap with the emission spectrum of the blue light emitting pixels for at least one incident angle greater than about 40 degrees or greater than about 50 degrees. The reflective polarizer can be disposed between an absorbing polarizer and a retarder layer. In some embodiments, a reflective polarizer has at least two, or at least three, substantially distinct reflection bands in the visible range (400 nm to 700 nm) for substantially normally incident light. In some embodiments, a reflective polarizer has at least one reflection band in the visible range for substantially normally incident light and at least one reflection band in the near infrared range (700 nm to 2500 nm) for substantially normally incident light. In some embodiments, the reflective polarizer substantially reflects substantially normally incident light for a first polarization state and substantially transmits substantially normally incident light for an orthogonal second polarization state for at least one wavelength in the visible range, or in a wavelength range of 450 nm to 650 nm, or in a wavelength range between peak emission wavelengths of blue and red pixels. In some such embodiments or in other embodiments, the reflective polarizer substantially transmits each of the first and second polarization states for at least one other wavelength in the visible range, or in a wavelength range of 450 nm to 650 nm, or in a wavelength range between peak emission wavelengths of blue and red pixels.

FIG. 1 is a schematic cross-sectional view of a display system 300 including a display panel 10 and a reflective polarizer 20 disposed on the display panel 10, according to some embodiments. The display system 300 can be adapted to display an image (e.g., in light 82, 85, 85') to a viewer 333. The display system 300 can further include an absorbing polarizer 50 disposed (e.g., indirectly) on the display panel 10 and a retarder layer 40 disposed between the absorbing polarizer 50 and the display panel 10. In some embodiments, a first adhesive layer 60 bonds the absorbing polarizer 50 to the reflective polarizer 20, and a second adhesive layer 70 bonds the reflective polarizer 20 to the retarder layer 40. The reflective polarizer and the absorbing polarizer, which can be a linear absorbing polarizer, can have substantially aligned pass axes (e.g., aligned to within 20 degrees, or within 10 degrees, or within 5 degrees). In some embodiments, an antireflection coating 53 is disposed on the absorbing polarizer 50 opposite the first adhesive layer 60. In some embodiments, a glass layer is disposed over the absorbing polarizer 50 and the antireflection coating 53 is disposed on the glass layer opposite the absorbing polarizer 50. Additional layer(s), such as an adhesive layer, can be disposed between the retarder layer 40 and the display panel 10, or the retarder layer 40 can be disposed directly on the display panel 10, for example. In embodiments where the retarder layer 40 is disposed directly on the display panel 10, FIG. 1 can be described as a schematic partially exploded view where the retarder layer 40 is shown spaced apart from the display panel 10 for ease of illustration.

Figure 2:
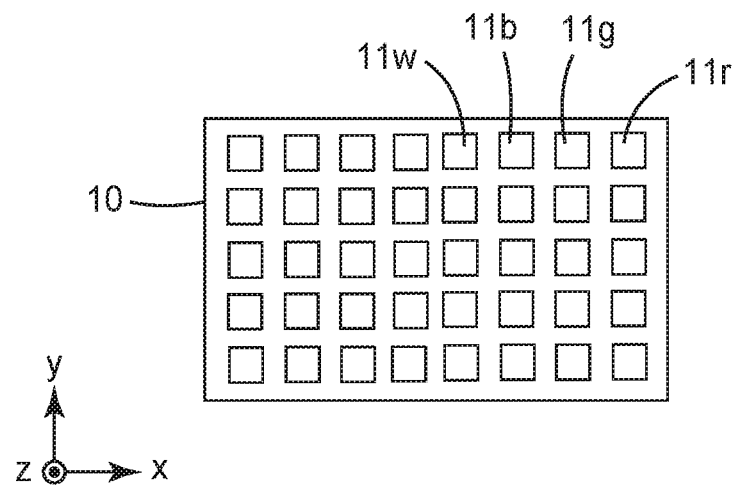
FIG. 2 is a schematic top view of a display panel.

FIG. 2 is a schematic top view of the display panel 10. In some embodiments, the display panel 10 includes a plurality of at least first light emitting pixels. In some embodiments, the display panel 10 includes a plurality of at least blue 11b, green 11g, and red 11r light emitting pixels. In some embodiments, the display panel 10 further includes a plurality of white light emitting pixels 11w. In some embodiments, the display panel 10 can be or include an organic light emitting diode (OLED) display panel, for example. In other embodiments, the display panel 10 can be a micro-LED display panel, for example.

Figure 3:
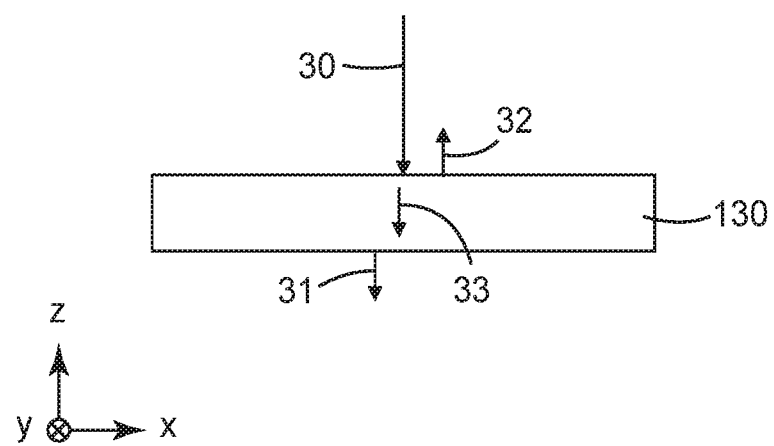
FIG. 3 is a schematic cross-sectional view of a light incident on a layer or element.

In some embodiments, various layers or elements of a display system can be characterized by the optical reflectance, transmittance, and/or absorbance of the layer or element. FIG. 3 is a schematic cross-sectional view of a light 30 incident on a layer or element 130. The layer or element 130 can represent the reflective polarizer 20 or the absorbing polarizer 50, for example. A portion 31 of the light 30 can be transmitted, a portion 32 of the light 30 can be reflected, and a portion 33 of the light 30 can be absorbed. In some embodiments, for substantially normally incident light 30 (e.g., within 20 degrees, or within 10 degrees, or within 5 degrees of normally incident), the reflective polarizer 20 reflects at least about 60% or at least 70% of the incident light 30 for at least one wavelength for a first polarization state (e.g., polarized along the x-axis), and transmits at least about 60% or at least about 70% of the incident light for the at least one wavelength for an orthogonal second polarization state (e.g., polarized along the y-axis). For example, the reflectance for the first polarization state can have the reflection spectrum 321 schematically depicted in FIG. 7 and the transmittance for the second polarization state can be as schematically denoted T in FIG. 7. In some embodiments, for substantially normally incident light 30, the absorbing polarizer 50 absorbs at least 60% or at least 70% of the incident light 30 for at least one wavelength for a first polarization state (e.g., x-axis). For example, the absorbance can be as schematically denoted A in FIG. 10.

In some embodiments, layer or element 130 schematically represents the display system 300. In some embodiments, the display system 300 has a photopic ambient reflectance for substantially normally incident light 30 of no more than about 15%, or no more than about 10%, or no more than about 8% (e.g., the reflected portion 32 can be small while the absorbed portion 33 can be large). Referring again to FIG. 1, in some embodiments, the display system 300 has a photopic reflectance for light 230 incident on the display system 300 at an angle of incidence α of no more than about 15%, or no more than about 10%, or no more than about 8% (e.g., as schematically represented by reflected light 232). The angle of incidence α can be about 8 degrees, for example. The photopic reflectance can be measured using a D65 light source. The photopic reflectance can determined using the CIE 1931 photopic luminosity function, for example. Reducing the bandwidth or the strength of the reflection band(s), for example, can reduce the photopic ambient reflectance.

Figure 4A:
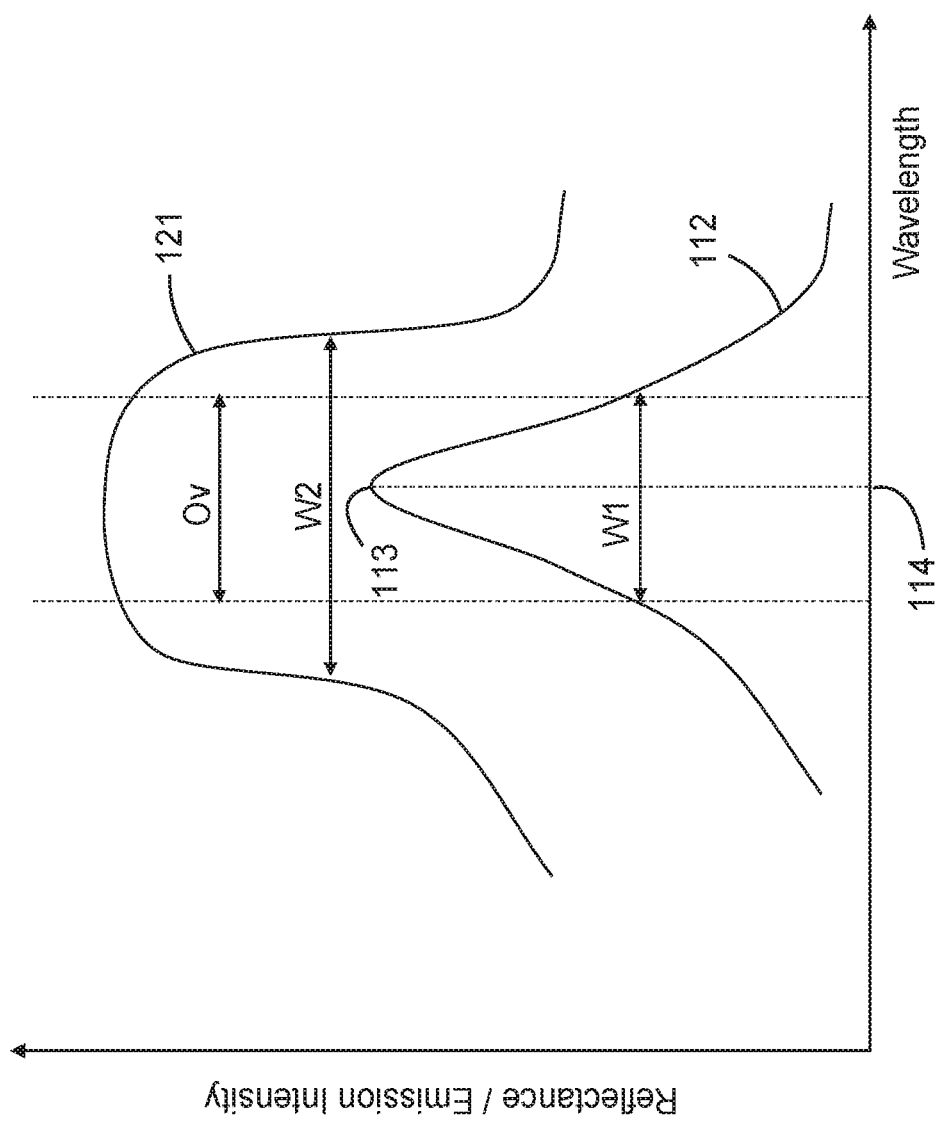
FIGS. 4A-4B are schematic plots of a reflection band of a reflective polarizer and of an emission spectrum of a pixel.
Figure 4B:
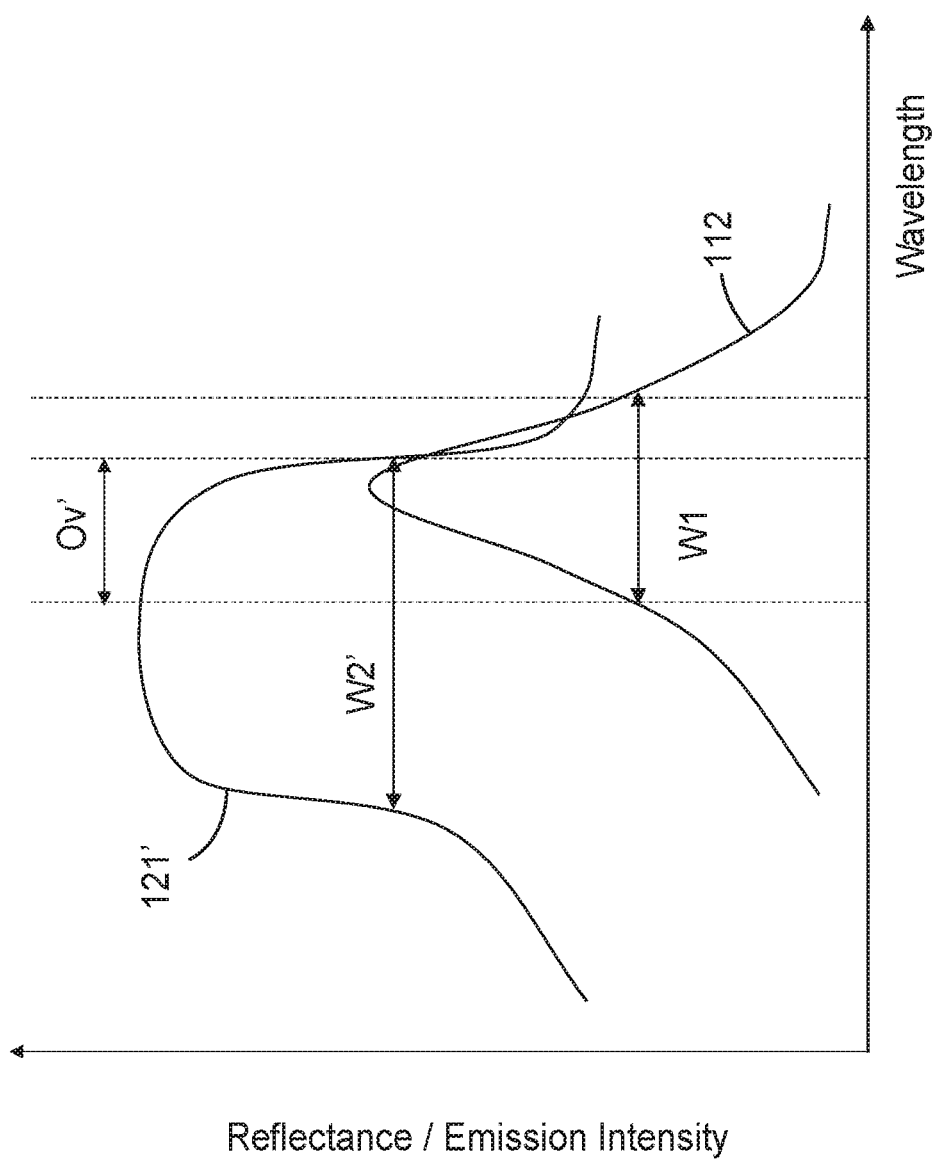

FIGS. 4A-4B are schematic plots of a reflection band 121, 121' of a reflective polarizer for a first (block) polarization state, and an emission spectrum 112 of a pixel. The emission spectrum 112 has an emission peak 113 at a peak wavelength 114 and has a full width at half maximum (FWHM) of W1. FIG. 4A shows a reflection band 121 where the reflection band 121 has a full width at half maximum W2, and FIG. 4B shows a reflection band 121' where the reflection band 121' has a full width at half maximum W2'. The reflection band 121 can be for substantially normally incident light and the reflection band 121' can be the same reflection band for light incident at an oblique angle which shifts the reflection band to lower wavelengths compared to normally incident light. Alternatively, the reflection band 121' can represent a reflection band of a different embodiment for substantially normally incident light. The FWHM W1 of the emission spectrum 112 overlaps the FWHM W2 of the reflective polarizer by an overlap range Ov, and the FWHM W1 of the emission spectrum 112 overlaps the FWHM W2' of the reflective polarizer by an overlap range Ov'. In the illustrated embodiment, Ov'<Ov.

Figure 5A:
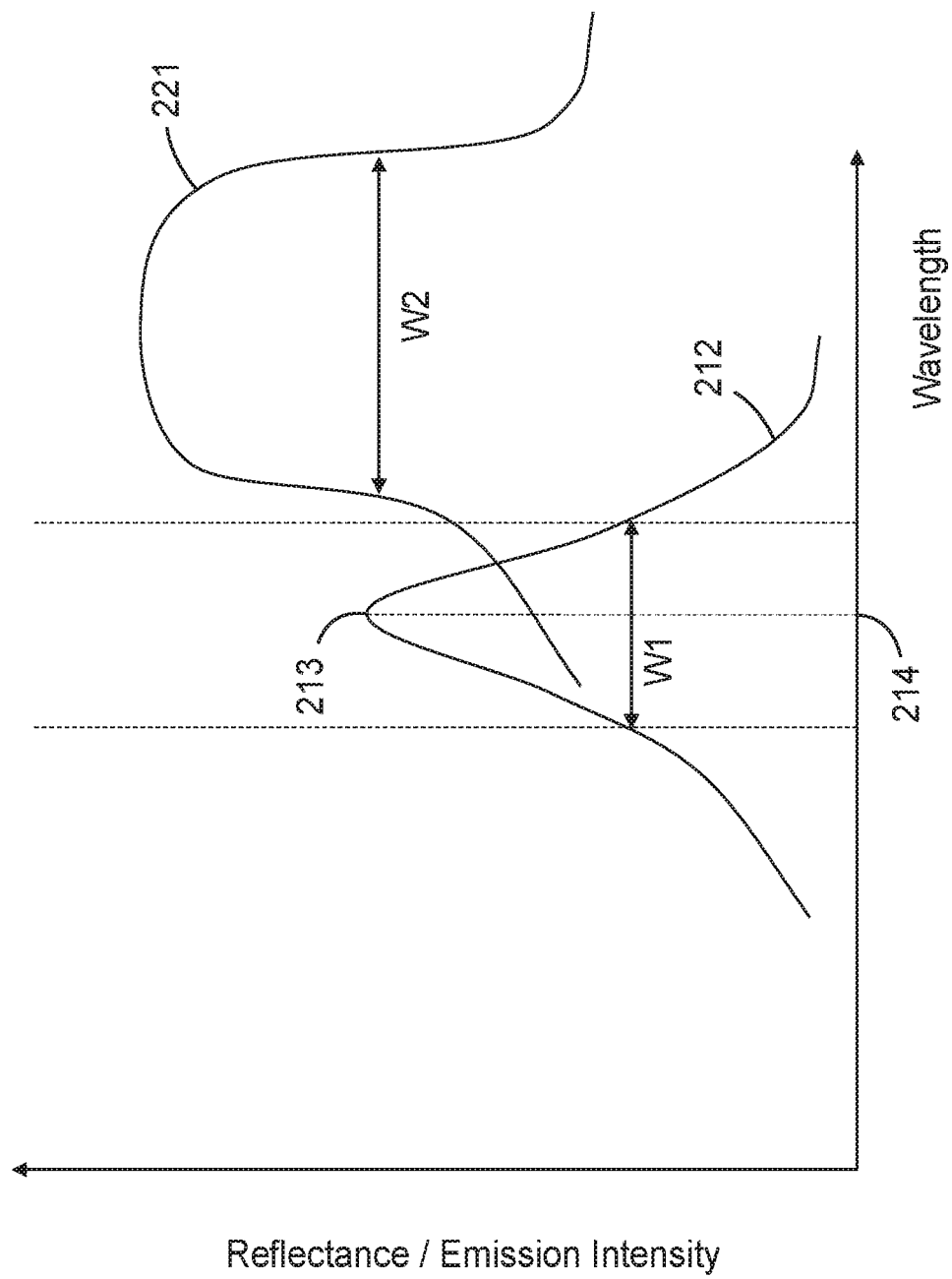
Figure 5B:
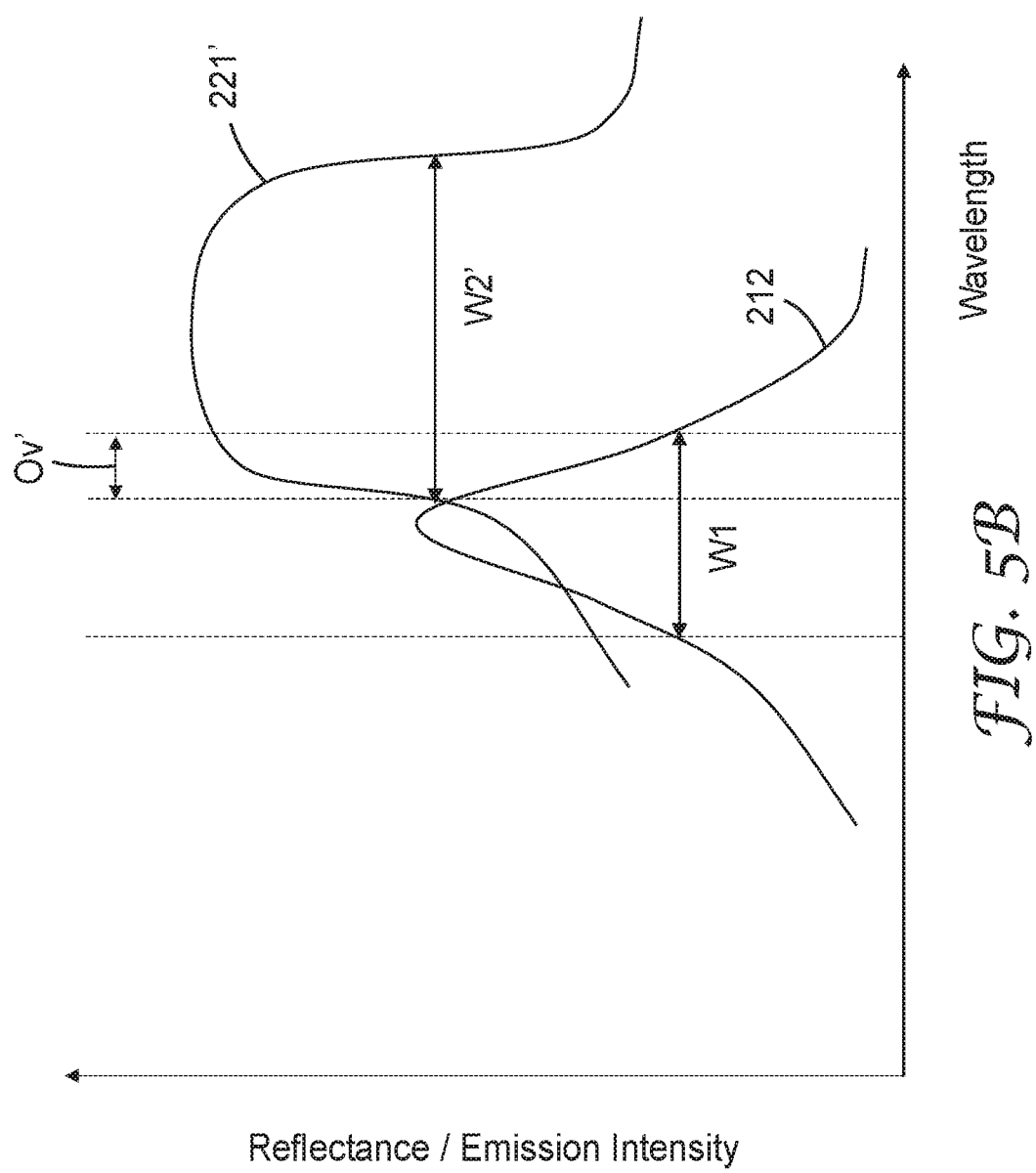

FIGS. 5A-5C are schematic plots of a reflection band 221, 221', 221" of a reflective polarizer for a first (block) polarization state, and an emission spectrum 212 of a pixel. The emission spectrum 212 has an emission peak 213 at a peak wavelength 214 and has a full width at half maximum (FWHM) of W1. FIG. 5A shows the reflection band 221 for substantially normally incident light where the reflection band 221 has a full width at half maximum W2; FIG. 5B shows the reflection band 221' which can be for light incident at an oblique angle relative to a normal to the reflective polarizer (or which can alternatively represent the reflection band of another embodiment at substantially normal incidence) where the reflection band 221' has a full width at half maximum W2' and is shifted to lower wavelengths compared to FIG. 5A; and FIG. 5C shows the reflection band 221" for light incident at a larger oblique angle relative to a normal to the reflective polarizer compared to FIG. 5B (or which can alternatively represent the reflection band of another embodiment at substantially normal incidence or at another angle of incidence) where the reflection band 221" has a full width at half maximum W2" and is shifted to lower wavelengths compared to FIG. 5B. The FWHM W1 of the emission spectrum 212 and the FWHM W2 of the reflective polarizer do not overlap. The FWHM W1 of the emission spectrum 212 and the FWHM W2' of the reflective polarizer overlaps by an overlap range Ov'. The FWHM W1 of the emission spectrum 212 and the FWHM W2" of the reflective polarizer overlaps by an overlap range Ov". In the illustrated embodiment, Ov">Ov'>0.

In some embodiments, the reflection band 121 and the emission spectrum 112 can represent a blue reflection band and the emission spectrum of a blue pixel, for example, and/or can represent a green reflection band and the emission spectrum of a green pixel, for example. In some embodiments, the reflection band 221 and the emission spectrum 212 can represent a red reflection band and the emission spectrum of a red pixel, for example. The emission spectra of pixels can be understood to be the emission spectra measured normal to the display panel, unless indicated differently.

Figure 6A:
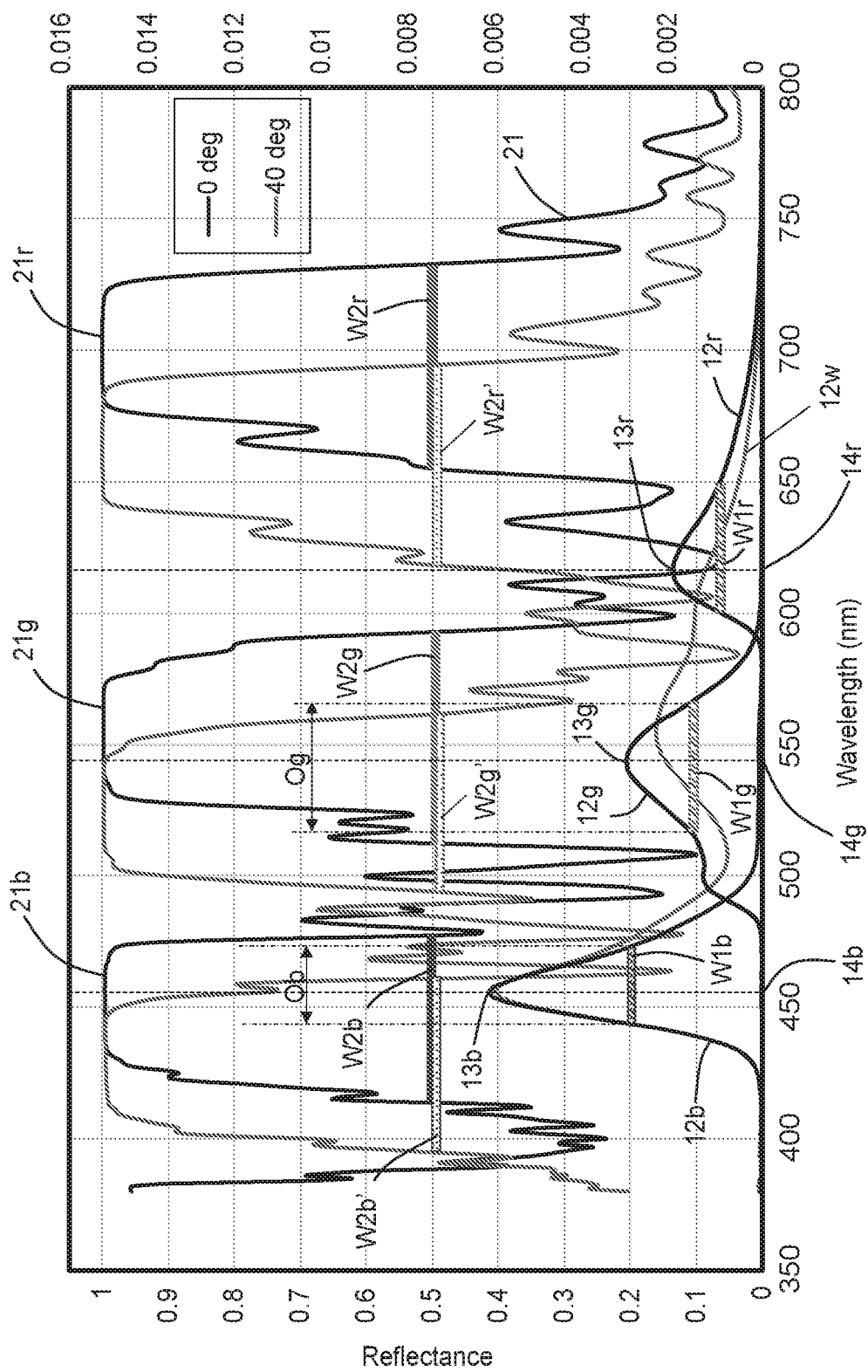
FIGS. 6A-6B are plots of a reflection spectrum of a reflective polarizer and emission spectra of light emitting pixels.
Figure 6B:
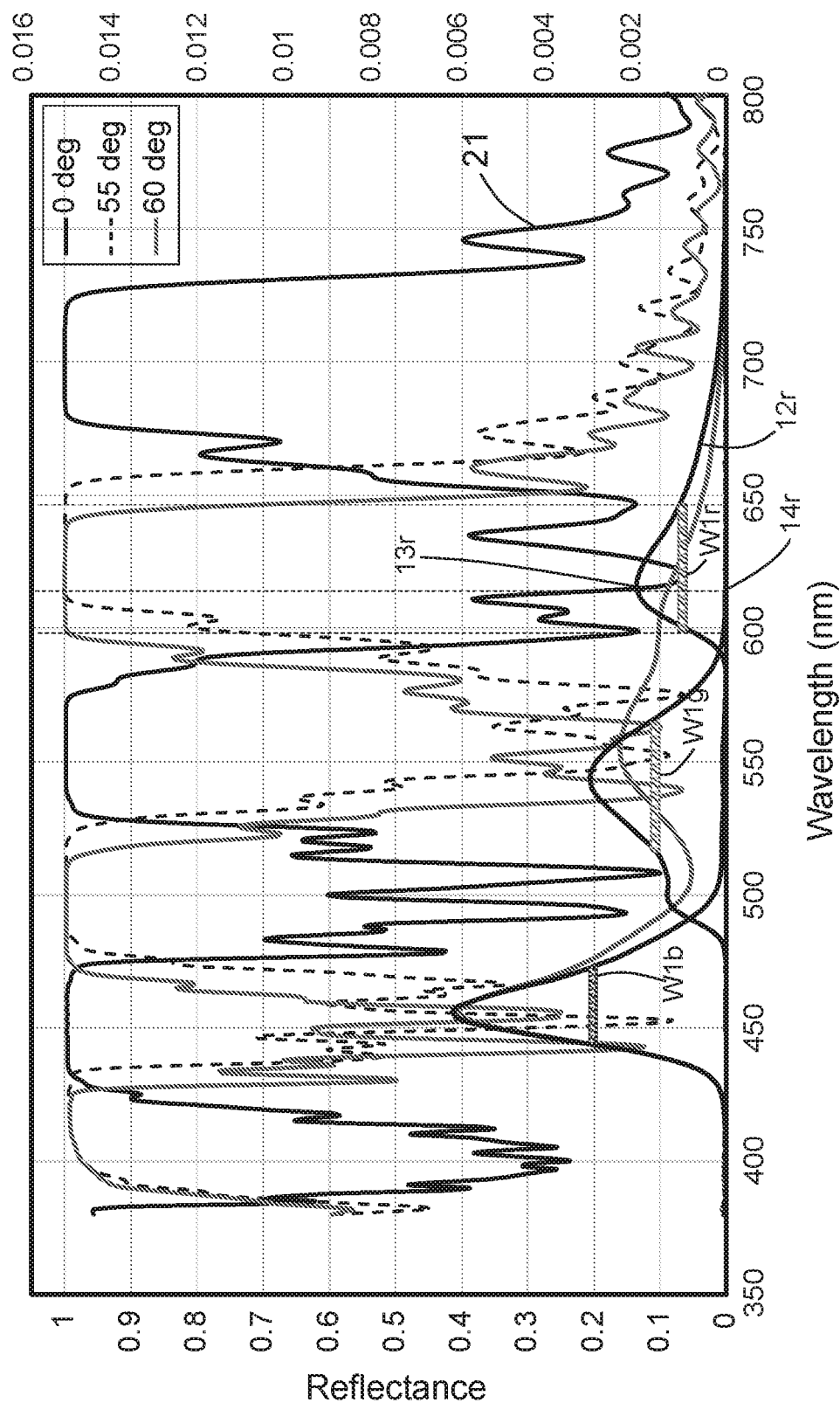

FIGS. 6A-6B are plots of a reflection spectrum 21 of a reflective polarizer and blue (12b), green (12g) and red (12r) emission spectra of respective blue (11b), green (11g) and red (11r) light emitting pixels. A white emission spectrum 12w of a white light emitting pixel 11w is also shown in the illustrated embodiment. The blue (12b), green (12g) and red (12r) emission spectra have respective blue (W1b), green (W1g) and red (W1r) full width at half maxima (FWHMs). The reflective polarizer includes substantially distinct blue (21b), green (21g) and red (21r) reflection bands with respective blue (W2b), green (W2g) and red (W2r) FWHMs at normal incidence and respective blue (W2b'), green (W2g') and red (W2r') FWHMs at an angle of incidence of 40 degrees. FIG. 6A shows the reflection bands at normal incidence and at an angle of incidence of 40 degrees. FIG. 6B shows the reflection bands at normal incidence and at angles of incidence of 55 degrees and 60 degrees. Reflection bands can be described as substantially distinct when the reflection bands do not overlap or have sufficiently small overlap that the full width at half maxima of the reflection bands do not overlap. Optical modeling showed that the reflective polarizer of FIGS. 6A-6B provides lower white point color shift of light emitted from a display system than from display systems incorporating conventional notch reflective polarizers (e.g., a lower color shift of substantially white light for view angles from 0 to 60 degrees on a CIE 1976 Uniform Chromaticity Scale u'v' diagram).

A blue, green, or red reflection band reflects visible light primarily in a blue, green, or red wavelength range, respectively, for substantially normally incident light. Blue, green, and red wavelength ranges can include a portion of ranges from about 400 nm to about 500 nm, about 500 nm to about 600 nm, and about 600 nm to about 700 nm, respectively. A red reflection band may extend into the infrared (e.g., up to about 750 nm) for substantially normally incident light, for example. A blue reflection band may extend into the ultraviolet (e.g., down to about 360 nm) for substantially normally incident light, for example. An infrared reflection band reflects in an infrared range (e.g., at least a portion of a range of about 700 nm to about 1500 nm) and may extend into the red (e.g., down to about 650 nm). A reflection band (e.g., 21r in the embodiment of FIG. 6A) that includes red wavelengths and infrared wavelengths may be referred to as a red reflection band, or as an infrared reflection band, or as a red-infrared reflection band.

In some embodiments, a display system 300 includes a display panel 10 including a plurality of at least blue (11*b*), green (11*g*) and red (11*r*) light emitting pixels having respective blue (12*b*), green (12*g*) and red (12*r*) emission spectra including respective blue (13*b*), green (13*g*) and red (13*r*) emission peaks at respective blue (14*b*), green (14*g*) and red (14*r*) peak wavelengths with respective blue (W1*b*), green (W1*g*) and red (W1*r*) full width at half maxima (FWHMs). The display system 300 can further include a reflective polarizer 20 disposed on the plurality of the at least blue, green and red light emitting pixels and including a reflection spectrum 21 including substantially distinct blue (21*b*), green (21*g*) and red (21*r*) reflection bands with respective blue (W2*b*), green (W2*g*) and red (W2*r*) FWHMs, such that for substantially normally incident light 30: the reflective polarizer 20 reflects at least about 60% of the incident light for at least one wavelength within each of the FWHMs of the blue, green and red reflection bands for a first polarization state (e.g., the reflectance at about 450 nm, about 550 nm, and about 680 nm is greater than 90% in FIG. 6A); the reflective polarizer 20 transmits at least about 60% of the incident light for the at least one wavelength within each of the FWHMs of the blue, green and red reflection bands for an orthogonal second polarization state (e.g., the reflectance in the second polarization (pass) state can follow curve 191 depicted in FIG. 7 and the transmittance T can be about 1 (or 100%) minus the reflectance along curve 191); and the reflective polarizer transmits at least about 30% of the incident light for at least one wavelength between the blue and green FWHMs (e.g., about 590 nm) and at least one wavelength between the green and red FWHMs (e.g., about 630 nm) for each of the first and second polarization states. In some embodiments, for substantially normally incident light 30, at least about 30%, or at least about 50%, or at least about 70%, or at least about 90% of the FWHMs of the blue and green emission spectra overlap the respective blue (O*b*) and green (O*g*) FWHMs of the reflective polarizer. In the embodiment illustrated in FIG. 6A, about 100% of the FWHMs of the emission spectra overlap the respective blue and green FWHMs of the reflective polarizer. In other embodiments, there can be less overlap. For example, the overlap at substantially normal incidence can appear as schematically illustrated in FIG. 4B with Ov'/W1 greater than about 0.3. In some embodiments, for substantially normally incident light 30, less than about 20%, or less than about 10%, or less than about 5% of the FWHM of the red emission spectrum overlaps the red FWHM of the reflective polarizer. In the embodiment illustrated in FIG. 6A, about 0% of the FWHM of the red emission spectrum overlaps the red FWHM of the reflective polarizer. In some embodiments, for the substantially normally incident light 30, there is no overlap between the red FWHM of the reflective polarizer and the FWHM of the red emission spectrum (e.g., the FWHMs can appear as schematically illustrated in FIG. 5A). In other embodiments, there can be some overlap. For example, the overlap at substantially normal incidence can appear as schematically illustrated in FIG. 5B with Ov'/W1 less than about 0.2.

In some embodiments, for the wavelengths in the red FWHM: for substantially normally incident light 30, the reflective polarizer 20 has an average reflectance (unweighted mean of reflectance over wavelengths in the red FWHM W1*r*) of less than about 40% for the first polarization state as can be seen in FIG. 6A, for example. In some embodiments, for the wavelengths in the red FWHM: for substantially normally incident light 30, the reflective polarizer 20 has an average reflectance of less than about 20% for the second polarization state (e.g., corresponding to reflectance 191 schematically illustrated in FIG. 7). In some embodiments, for the wavelengths in the red FWHM: for light incident at at least one incident angle greater than about 50 degrees or in a range of about 50 degrees to about 80 degrees, the reflective polarizer has an average reflectance of greater than about 60% for the first polarization state as can be seen in FIG. 6B, for example. In some embodiments, for the wavelengths in the red FWHM: for substantially normally incident light 30, the reflective polarizer 20 has an average reflectance of less than about 15% for the second polarization state. In some embodiments, for the wavelengths in the red FWHM: for light incident at at least one incident angle greater than about 50 degrees or in a range of about 50 degrees to about 80 degrees, the reflective polarizer has an average reflectance of greater than about 70% for the first polarization state The display panel 10 can include pixels having at least three different colors. Alternatively, fewer colors may be included. For example, the display panel can optionally be a monochrome display panel.

In some embodiments, a display system 300 includes a display panel 10 including a plurality of first light emitting pixels (e.g., 11*r*) having a first emission spectrum 12*r* including a first emission peak 13*r* at a first peak wavelength 14*r* with a first full width at half maximum W1*r*. The first light emitting pixels can be red light emitting pixels, for example. The display system 300 can include a reflective polarizer 20 disposed on the plurality of first light emitting pixels 11*r*, such that for the wavelengths in the first FWHM: for substantially normally incident light 30, the reflective polarizer has an average reflectance of less than about 40% for a first polarization state (e.g., x-axis), and an average reflectance of less than about 20% for an orthogonal second polarization state (e.g., y-axis); and for light incident at at least one incident angle greater than about 50 degrees or in a range of about 50 degrees to about 80 degrees, the reflective polarizer has an average reflectance of greater than about 60% for the first polarization state. In some embodiments, for the wavelengths in the first FWHM and for substantially normally incident light 30, the reflective polarizer has an average reflectance of less than about 30% or less than about 25% for a first polarization state. In some embodiments, for the wavelengths in the first FWHM and for substantially normally incident light 30, the reflective polarizer has an average reflectance of less than about 10% for an orthogonal second polarization state. In some embodiments, for the wavelengths in the first FWHM and for light incident at at least one incident angle greater than about 50 degrees or in a range of about 50 degrees to about 80 degrees, the reflective polarizer has an average reflectance of greater than about 70% for the first polarization state.

In some embodiments, the display system 300 further includes a retarder layer 40 disposed between the reflective polarizer 20 and the display panel 10. In some embodiments, the display system 30 further includes an absorbing polarizer 50 where the reflective polarizer 20 is disposed between the absorbing polarizer 50 and the retarder layer 40. In some embodiments, the display panel 10 further includes a plurality of second light emitting pixels (11*g*) and a plurality of third light emitting pixels (11*b*). In some embodiments, the first light emitting pixels are red light emitting pixels, the second light emitting pixels are green light emitting pixels, and the third light emitting pixels are blue light emitting pixels. In some embodiments, the display panel 10 further includes a plurality of fourth light emitting pixels (11w) which can be white light emitting pixels.

Figure 7:
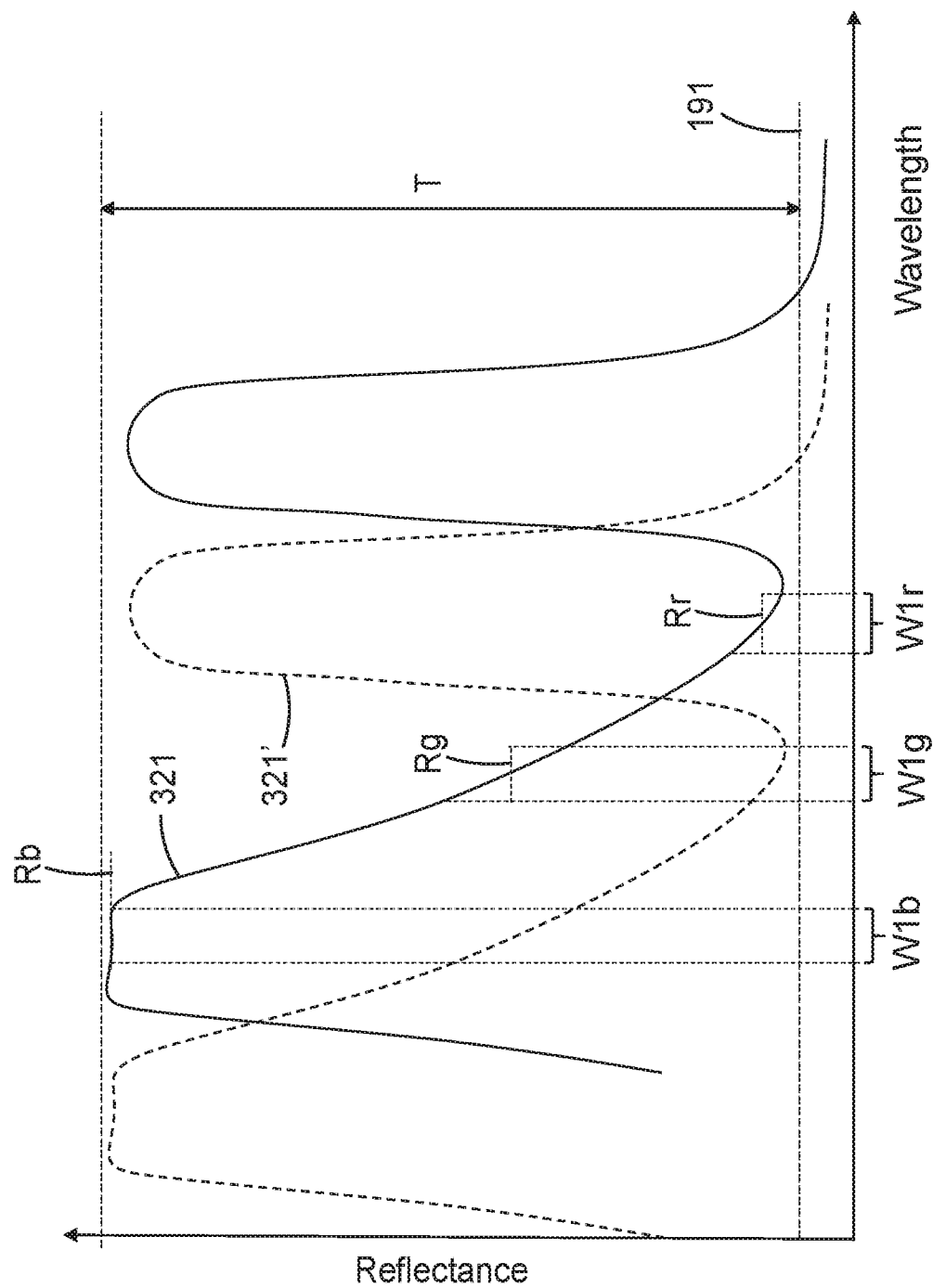
FIG. 7 is a schematic plot of a reflection spectrum of a reflective polarizer for substantially normally incident light and for obliquely incident light.
Figure 8:
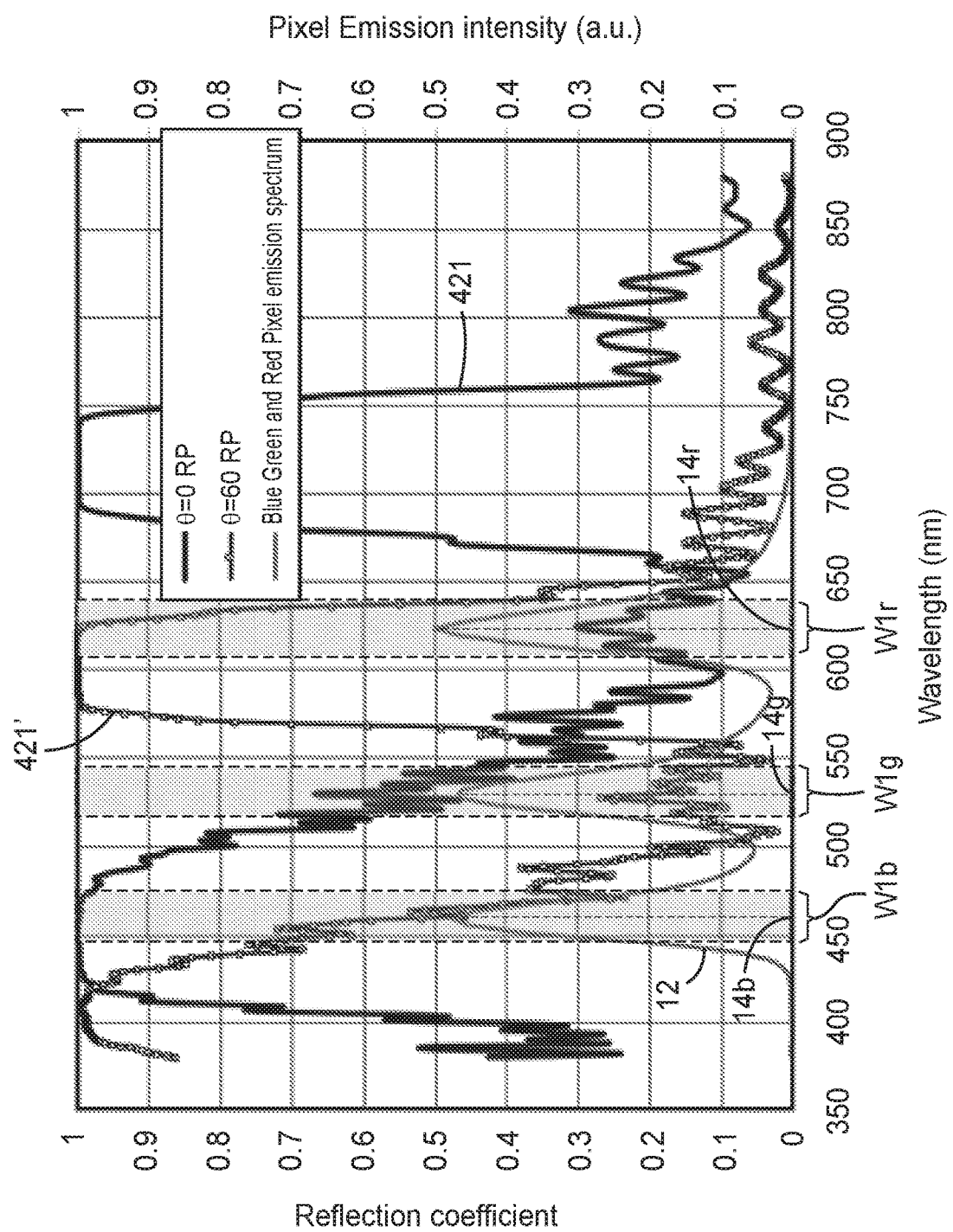
FIG. 8 is a plot of the reflectance of a reflective polarizer for substantially normally incident light and for light having an angle of incidence of 60 degrees.

FIG. 7 is a schematic plot of a reflection spectrum 321, 321' of a reflective polarizer for substantially normally incident light (spectrum 321) and for obliquely incident light (spectrum 321', which can be for an incident angle greater than about 40 degrees or greater than about 50 degrees, for example) for a first polarization state (e.g., x-axis) and a reflection spectrum 191 for substantially normally incident light for a second polarization state (e.g., y-axis). In some embodiments, the absorbance of the reflective polarizer is negligible so that the transmittance T is about 1 (or 100%) minus the reflectance. Blue, green and red FWHMs, W1b, W1g, and W1r, respectively, for some embodiments of the display panel 10 are indicated. FIG. 8 is a plot of a calculated reflection spectrum 421, 421' of a reflective polarizer for substantially normally incident light (spectrum 421) and for light having an angle of incidence (angle to normal) of 60 degrees (spectrum 421') for a first polarization state (x-axis) where emission spectra 12 is included in the figure.

In some embodiments, for the first polarization state: for substantially normally incident light 30, the reflective polarizer has a smaller reflectance (e.g., smaller by at least 10 percent, or by at least 20 percent, or by at least 40%) at the red emission peak wavelength 14r than the green emission peak wavelength 14g (e.g., as can be seen in FIG. 8 and in FIG. 7 when the emission peaks are within the respective FWHMs). In some embodiments, for the first polarization state: for at least one incident angle greater than about 40 degrees or greater than about 50 degrees or in a range of about 40 degrees to about 80 degrees, the reflective polarizer has a greater reflectance at the red emission peak wavelength 14r than the green emission peak wavelength 14g (e.g., as can be seen in FIG. 8 and in FIG. 7 when the emission peaks are within the respective FWHMs). In some such embodiments or in other embodiments, for substantially normally incident light 30 and wavelengths in the blue, green and red FWHMs, W1b, W1g, and W1r, the reflective polarizer has respective average reflectances Rb, Rg and Rr for the first polarization state, where Rb>Rg>Rr (as can be seen in FIGS. 7-8, for example). In some such embodiments or in other embodiments, for substantially normally incident light 30 and wavelengths in the blue, green and red FWHMs, W1b, W1g, and W1r, the reflective polarizer has an average transmittance of greater than about 60% or greater than about 70% for wavelengths in each FWHM for an orthogonal second polarization state (e.g., corresponding to the transmittance T schematically illustrated in FIG. 7). In some embodiments. Rb−Rg is greater than about 0.2 (or about 20%) or greater than about 0.4 (or about 40%). In some embodiments, Rg−Rr is greater than about 0.1 (or about 10%) or greater than about 0.2 (or about 20%).

In some embodiments, a display system 300 includes a display panel 10 including a plurality of blue (11b), green (11g) and red (11r) light emitting pixels having respective blue (13g), green (13g) and red (13r) emission peaks; and a reflective polarizer 20 disposed on the plurality of the light emitting pixels and having a reflection spectrum 21 including substantially distinct blue (21b), green (21g) and red (21r) reflection bands, such that for substantially normally incident light (30) and for at least one wavelength within each of the distinct blue, green and red reflection bands, the reflective polarizer reflects at least about 70% of the incident light for a first polarization state (x-axis) and transmits at least about 70% of the incident light for an orthogonal second polarization state (y-axis). In some such embodiments, for the first polarization state: for substantially normally incident light, the reflective polarizer has a smaller reflectance at the red emission peak than the green emission peak; and for at least one incident angle greater than about 40 degrees or greater than about 50 degrees or in a range of about 40 degrees to about 80 degrees, the reflective polarizer has a greater reflectance at the red emission peak than the green emission peak.

In some embodiments, a display system 300 includes an emissive display (e.g., corresponding to display panel 10) comprising a plurality of at least blue (11b), green (11g) and red (11r) light emitting pixels including emission peaks at respective blue (14b), green (14g) and red (14r) peak wavelengths with respective blue (W1b), green (W1g) and red (W1r) full width at half maxima (FWHMs). The emissive display can be or include an organic light emitting display, or a micro-LED display, for example. The display system 300 can further include: a reflective polarizer disposed on the emissive display, such that for substantially normally incident light 30 and wavelengths in the blue, green and red FWHMs, the reflective polarizer has: respective average reflectances Rb, Rg and Rr for a first polarization state, Rb>Rg>Rr; and an average transmittance of greater than about 60% or greater than about 70% for wavelengths in each FWHM for an orthogonal second polarization state. Rb-Rg and/or Rg-Rr can be in any of the ranges described elsewhere herein. As described further elsewhere herein, the display system 300 can further include a retarder layer 40 disposed on the emissive display The retarder layer 40 can include films, coatings or a combination of films and coatings. Exemplary films include birefringent polymer film retarders, such as those available from Meadowlark Optics (Frederick, CO), for example. Exemplary coatings for forming a retarder layer include the linear photopolymerizable polymer (LPP) materials and the liquid crystal polymer (LCP) materials described in U.S. Pat. App. Pub. Nos. 2002/0180916 (Schadt et al.), 2003/028048 (Cherkaoui et al.), 2005/0072959 (Moia et al.) and 2006/0197068 (Schadt et al.), and in U.S. Pat. No. 6,300,991 (Schadt et al.). Suitable LPP materials include ROP-131 EXP 306 LPP and suitable LCP materials include ROF-5185 EXP 410 LCP, both available from ROLIC Technologies Ltd. (Allschwil, Switzerland).

Figure 9:
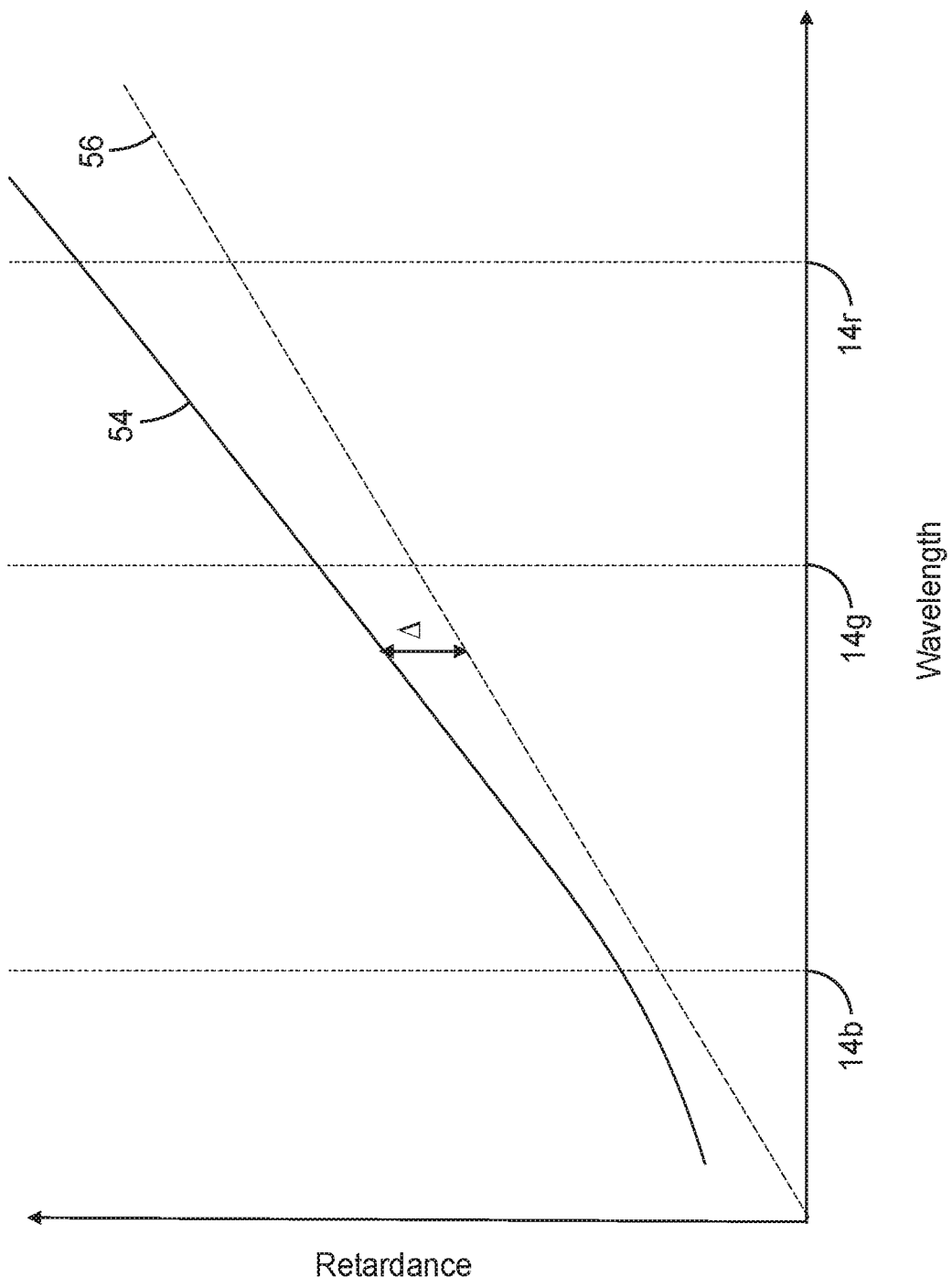
FIG. 9 is a schematic plot of retardance versus wavelength.

FIG. 9 is a schematic plot of retardance versus wavelength illustrating a relationship 56 between wavelength and retardance embodied by an ideal quarter-wave retarder, where wavelength and retardance vary linearly, and illustrating an exemplary relationship 54 between wavelength and retardance for some embodiments of the retarder layer 40. It can also be seen that a wavelength-dependent deviation A exists between the retarder layer relationship 54 and the ideal quarter-wave relationship 56. In some embodiments, the retarder layer 40 has a smaller deviation A from being a quarter-wave retarder at the blue peak wavelength 14b than at the red peak wavelength 14r. In some embodiments, the retarder layer 40 has a smaller deviation A from being a quarter-wave retarder at the blue peak wavelength 14b than at the green peak wavelength 14g. It has been found that having a retarder layer 40 with a lower deviation A for blue wavelengths than for red wavelengths, for example, can result in a reduced color shift with view angle of ambient light reflected from the display. A retarder layer can be selected to have a smaller deviation A from being a quarter-wave retarder at a blue wavelength by suitably selecting the thickness of the retarder layer. Suitable retarder layers, and display systems including the retarder layers, are described further in U.S. Pat. Appl. No. 62/906,852 filed on Sep. 27, 2019 and titled "COLOR NEUTRAL EMISSIVE DISPLAY WITH NOTCHED REFLECTIVE POLARIZER".

Figure 10:
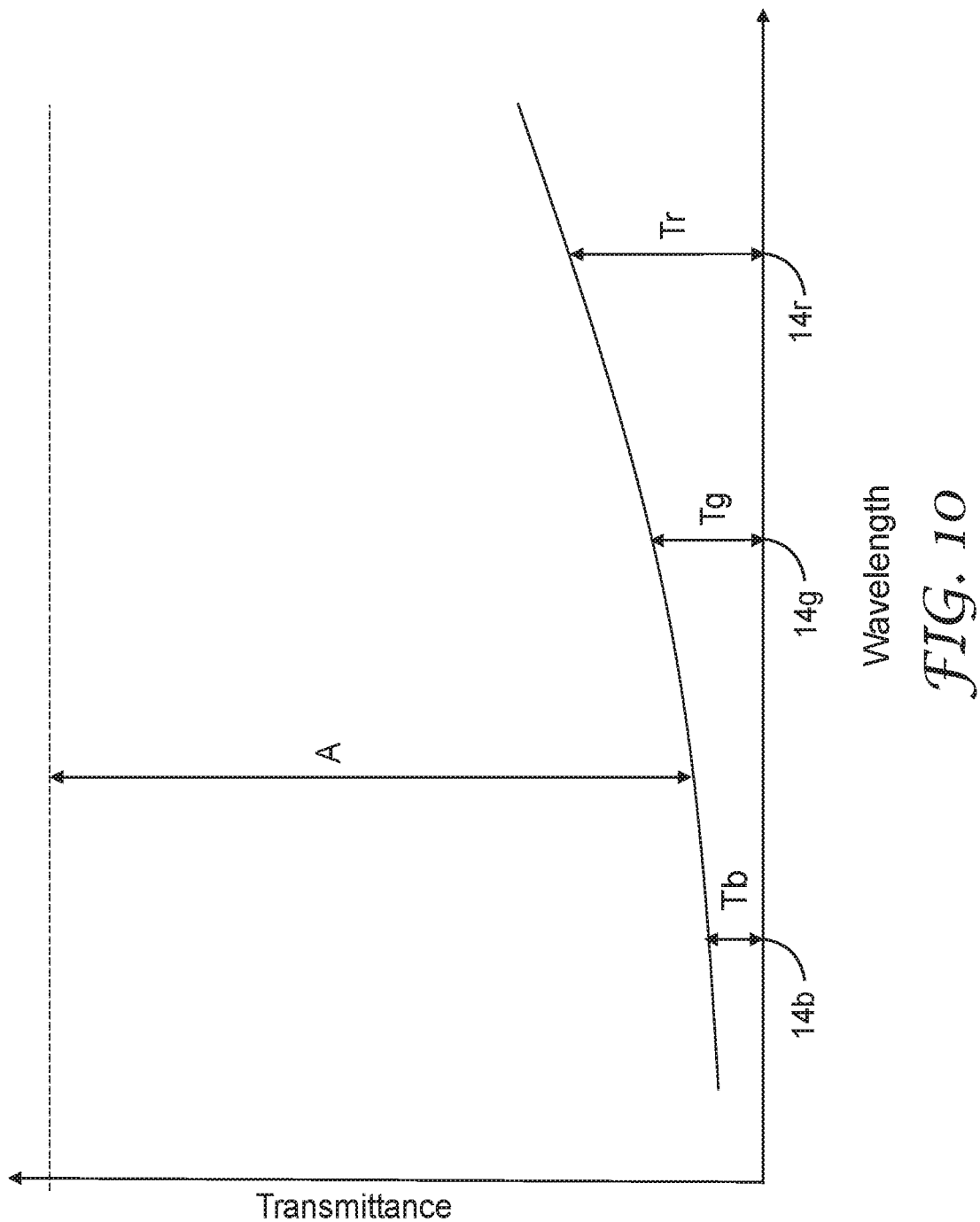
FIG. 10 is a schematic plot of transmittance of an absorbing polarizer versus wavelength.

FIG. 10 is a schematic plot of transmittance of an absorbing polarizer for substantially normally incident light 30 having the first polarization state (e.g., x-axis). In some embodiments, Fresnel reflections are negligible, and the absorbance A of the absorbing polarizer is about 1 (or 100%) minus the transmittance. In some embodiments, the absorbance A is at least 60% or at least 70% throughout the visible range (400 nm to 700 nm) or for each of the blue, green and red peak wavelengths. In some embodiments, the display system 300 includes an absorbing polarizer 50 disposed on the reflective polarizer 20 opposite the retarder layer 40, such that for substantially normally incident light having the first polarization state, the absorbing polarizer 50 absorbs at least 60% or at least 70% of the incident light for each of the blue, green and red peak wavelengths, and has average transmittances Tb, Tg and Tr for wavelengths in the respective blue, green and red FWHMs. In some embodiments, Tr>Tb and Tg (i.e., Tr>Tb and Tr>Tg). In some embodiments, Tr is less than about 30%, or less than about 20%, or less than about 10%. In some embodiments, Tr-Tg is greater than about 5% (or about 0.05). In some embodiments, Tr-Tb is greater than about 5% (or about 0.05) or greater than about 8% (or about 0.08). In some embodiments, the transmittance for substantially normally incident light having the second polarization state is at least 60%, or at least 70%, or at least 80% for each of the blue, green and red peak wavelengths. Suitable absorbing polarizers are available from Sanritz.

In some embodiments, the reflective polarizer 20 results in an optical gain of the optical system by recycling light that would otherwise be absorbed by the absorbing polarizer. The optical gain is the luminance (photopic brightness) of the optical system with the reflective polarizer divided by the luminance of the optical system without the reflective polarizer. The optical gain can be determined as a function of wavelength and/or can be determined for different color pixels. The optical gain can be determined for different propagation directions which can be defined by an angle (see, e.g., polar angles θ, θ' depicted in FIG. 1) of the light propagation direction relative to a display normal outside the display system.

Figure 11:
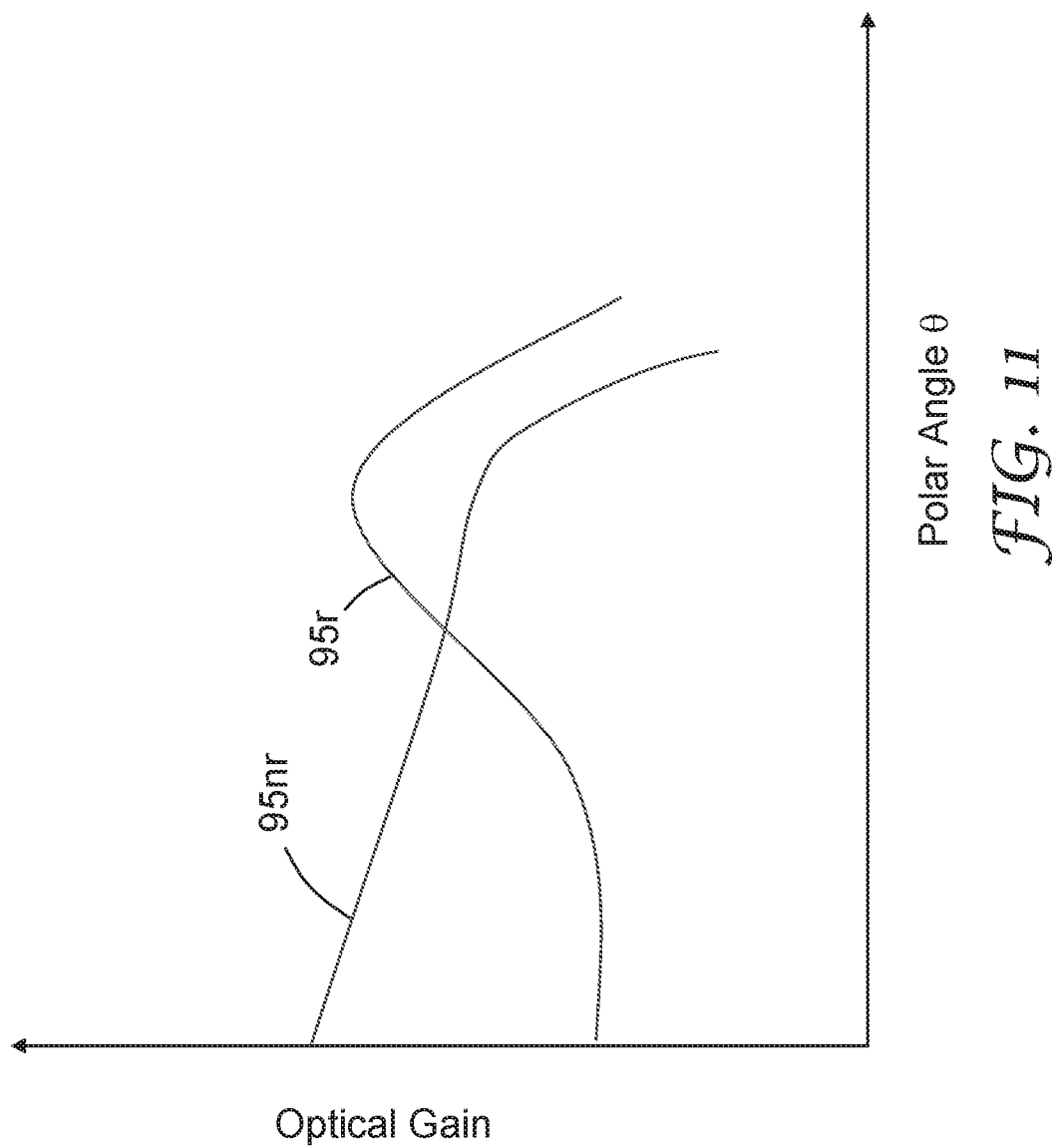
FIG. 11 is a schematic plot of optical gain as a function of polar angle.
Figure 12:
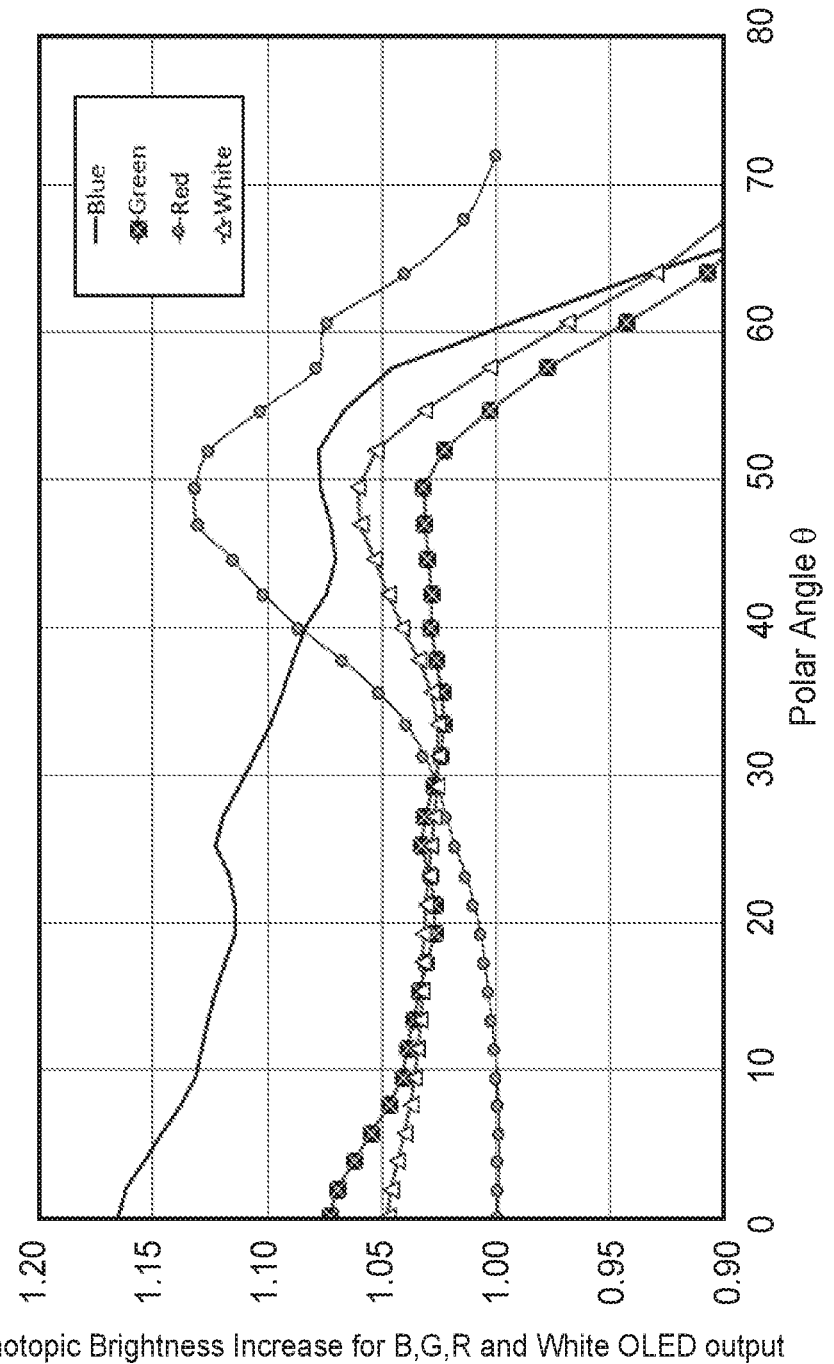
FIG. 12 is a plot of calculated optical gain as a function of polar angle.

FIG. 11 is a schematic plot of optical gain 95r for a first wavelength and optical gain 95nr for a different second wavelength as a function of polar angle θ. The first wavelength can be a peak wavelength of a red pixel, for example. The second wavelength can be a peak wavelength of a different color (e.g., blue or green or white) pixel, for example. FIG. 12 is a plot of calculated optical gain 100b, 100g, 100r for blue, green, and red pixels, respectively, and the optical gain 100w for the white output generated by all of the blue, green and red pixels emitting simultaneously.

In some embodiments, the reflective polarizer 20 is disposed between the absorbing polarizer 50 and the retarder layer 40, such that the display system 300 has an optical gain $g_0$ along a first direction 83 substantially normal to the display and an optical gain $g_1$ along a second direction 86 making an angle θ greater than about 60 degrees, or in a range of about 60 degrees to about 80 degrees, with the first direction. In some embodiments, $g_0$ is greater than $g_1$ for the blue and green peak wavelengths 14b and 14g; and $g_0$ is less than $g_1$ for the red peak wavelength 14r.

In some embodiments, a display system 300 includes a display (e.g., corresponding to display panel 10) including a plurality of blue (11b), green (11g), and red (11r) light emitting pixels; an absorbing polarizer 50 disposed on the display; a retarder layer 40 disposed between the absorbing polarizer 50 and the display; and a reflective polarizer 20 disposed between the absorbing polarizer 50 and the retarder layer 40, such that the display has an optical gain $g_0$ along a first direction 83 substantially normal to the display and an optical gain $g_1$ along a second direction 86 making an angle θ greater than about 60 degrees with the first direction. In some embodiments, $g_0$ is greater than $g_1$ for wavelengths corresponding to peak emissions of the blue (11b) and green (11g) light emitting pixels; and $g_0$ is less than $g_1$ for wavelengths corresponding to a peak emission of the red light emitting pixels 11r. In some embodiments, for wavelengths corresponding to a peak emission of the red light emitting pixels, the display has a maximum gain along a direction making an angle in a range of 40 to 60 degrees with the first direction (e.g., as can be seen in FIG. 12). In some embodiments, the display further includes a plurality of white (11w) light emitting pixels. In some embodiments, $g_0$ is greater than $g_1$ for a wavelength corresponding to a peak emission of the white (11w) light emitting pixels. The peak emission wavelength of the white light emitting pixels can be about equal to the peak emission wavelength of the blue light emitting pixels (see, e.g., FIG. 6A).

Figure 13B:
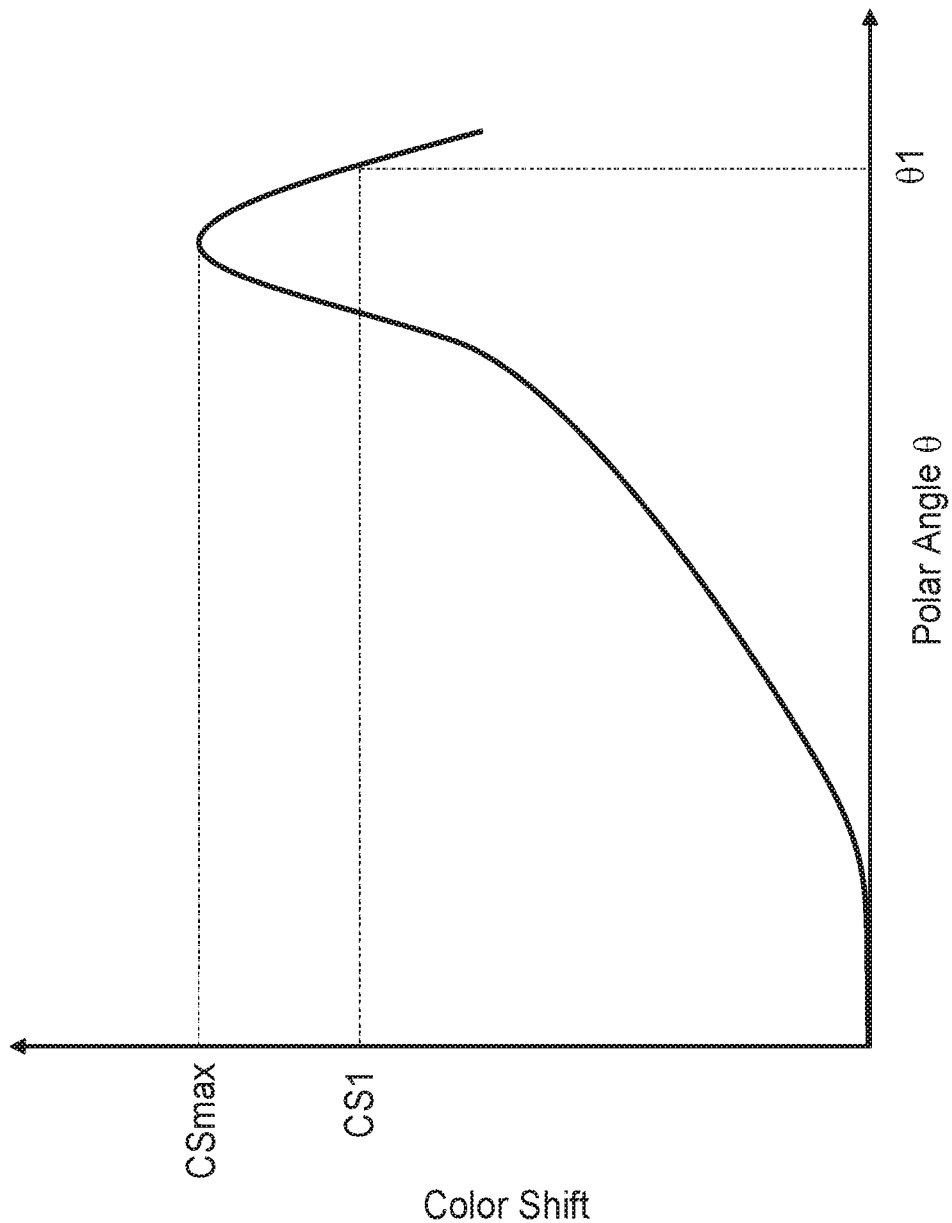
FIG. 13B is a schematic plot of color shift of light exiting a display system as a function of viewing angle.

FIG. 13A is a schematic plot of color shift of light exiting a display system on a chromaticity diagram. As the polar angle (angle relative to a normal to a display panel) varies, the color moves along the illustrated curve. A chromaticity diagram represents a color using two coordinates which are labeled Chromaticity Coordinate 1 and Chromaticity Coordinate 2 in the figure. For example, FIG. 13A can schematically represent a CIE (International Commission on Illumination) 1931 xy chromaticity diagram where Chromaticity Coordinate 1 is the CIE x coordinate and Chromaticity Coordinate 2 is the CIE y coordinate. As another example, FIG. 13A can schematically represent a CIE 1976 Uniform Chromaticity Scale (UCS) u'v' diagram where Chromaticity Coordinate 1 is the CIE u' coordinate and Chromaticity Coordinate 2 is the CIE v' coordinate. FIG. 13B is a schematic plot of color shift of light exiting a display system and propagating along a direction at a polar angle θ (angle relative to a normal to a display panel) as a function of the polar angle θ (which can also be referred to as a view angle). The light may be a substantially white light, at least for light propagating substantially normal to the display (θ approximately 0 degrees). A substantially white light white light may have x and y coordinates on a CIE 1931 xy chromaticity diagram each in a range of about 0.25 to about 0.35, for example. A substantially white light may be referred to as a white light since it will be understood that light characterized by a range of chromaticity coordinates can be considered to be white. The color of the light can vary with the angle θ. The color shift is the difference in the color of light at an angle θ relative to light at angle of zero. The color shift can be a (Euclidean) distance on the CIE 1931 xy chromaticity diagram (e.g., square root of $[(x_2-x_1)^2+(y_2-y_1)^2]$, where the subscripts represent first and second points) or a (Euclidean) distance in u'v' coordinates on a CIE 1976 UCS u'v' diagram (e.g., square root of $[(u'_2-u'_1)^2+(v'_2-v'_1)^2]$, where the subscripts represent first and second points), for example. The color shift can be quantified as a maximum color shift CSmax as the angle θ varies from zero to some specified angle (e.g., about 60 degrees, or about 70 degrees, or about 80 degrees), or as the color shift CS1 at some specified angle θ1 (e.g., about 60 degrees, or about 70 degrees, or about 80 degrees, or an angle greater than about 60 degrees, or an angle in a range from about 60 degrees to about 80 degrees). In some embodiments, the color shift CSmax and/or CS1 is no more than about 0.9 times, or no more than about 0.8 times, or no more than about 0.7 times the corresponding color shift of an otherwise equivalent display system that does not include the reflective polarizer 20 (e.g., the otherwise equivalent display system can appear as display system 300 in FIG. 1 with the reflective polarizer 20 omitted and with the absorbing polarizer 50 attached to the retarder layer 40).

Referring again to FIG. 1, in some embodiments, when a display or display panel 10 emits a substantially white light 80, a first portion 81 of the emitted substantially white light exits the display system as a first light 82 propagating along a first direction 83 substantially normal to the display or display panel and a second portion 84 of the emitted substantially white light exits the display system as a second light 85 propagating along a second direction 86 making an angle θ with the first direction. The angle θ can be about 60 degrees, or about 70 degrees, or about 80 degrees, or an angle greater than about 60 degrees, or an angle in a range of about 60 degrees to about 80 degrees, for example. In some embodiments, the first and second lights correspond to respective first and second points (e.g., points 90 and 91) on a CIE 1976 Uniform Chromaticity Scale u'v' diagram, and a distance (e.g., CS1 or d) between the first and second points can be less than about 0.03, or less than about 0.025, or less than about 0.023, or less than about 0.02, or less than about 0.015, or less than about 0.01, or even less than about 0.009. In some embodiments, the first and second lights correspond to respective first and second points (e.g., points 90 and 91) on a CIE 1931 xy chromaticity diagram, and a distance (e.g., CS1 or d) between the first and second points can be less than about 0.06.

The reflective polarizer can have a reflection spectrum selected to provide lower white point color shift of light emitted from a display system than from display systems incorporating conventional notch reflective polarizers while providing lower ghosting and/or lower ambient reflection than display systems using broadband reflective polarizers. The reflective polarizer can have a high transmission (e.g., at least about 60% or at least about 70%) for each of two orthogonal polarization states for at least one wavelength between a peak emission wavelength 14b of the blue light emitting pixels 11b and a peak emission wavelength 14r of the red light emitting pixels 11r, and can have a high reflectance (e.g., at least about 60% or at least about 70%) for a first polarization state for at least one other wavelength between a peak emission wavelength 14b of the blue light emitting pixels 11b and a peak emission wavelength 14r of the red light emitting pixels 11r.

In some embodiments, a display system 300 includes a display (e.g., corresponding to display panel 10) including a plurality of at least blue, green and red light emitting pixels; an absorbing polarizer 50 disposed on the display; a retarder layer 40 disposed between the absorbing polarizer 50 and the display; and a reflective polarizer 20 disposed between the absorbing polarizer and the retarder layer 40, where the reflective polarizer transmits at least about 60% or at least about 70% of substantially normally incident light 30 for each of orthogonal first and second polarization states for at least one first wavelength in a range from a peak emission wavelength 14b of the blue light emitting pixels 11b to a peak emission wavelength 14r of the red light emitting pixels 11r, such that when the display emits a substantially white light 80, a first portion of the emitted substantially white light exits the display system as a first light 82 propagating along a first direction 83 substantially normal to the display and a second portion of the emitted substantially white light exits the display system 300 as a second light 85 propagating along a second direction 86 making an angle θ of about 60 degrees with the first direction. The first and second lights 82 and 85 correspond to respective first and second points on a CIE 1976 Uniform Chromaticity Scale u'v' diagram where a distance d between the first and second points is less than about 0.023, or the distance d can be in any of the ranges described elsewhere herein. In some embodiments, for substantially normally incident light, the reflective polarizer 20 reflects at least about 60% or at least 70% of the incident light for the first polarization state for at least one second wavelength in a range from the peak emission wavelength 14b of the blue light emitting pixels to the peak emission wavelength 14r of the red light emitting pixels. In some embodiments, for substantially normally incident light, the reflective polarizer 20 transmits at least about 60% or at least 70% of the incident light for the second polarization state for the at least one second wavelength.

In some embodiments, when the display or display panel emits the substantially white light 80, a third portion 84' of the emitted substantially white light exits the display system as a third light 85' propagating along a third direction 86' making an angle θ' with the first direction 83. In some embodiments, the first light corresponds to a first point on a CIE 1976 Uniform Chromaticity Scale u'v' diagram, the third light corresponds to a third point on the CIE 1976 Uniform Chromaticity Scale u'v' diagram, and a maximum distance (e.g., CSmax) between the first and third points as the angle θ' varies from about zero degrees to about 70 degrees is less than about 0.025, or less than about 0.023, or less than about 0.02, or less than about 0.016, or less than about 0.015, or less than about 0.014. In some embodiments, the first light corresponds to a first point on a CIE 1931 xy chromaticity diagram, the third light corresponds to a third point on the CIE 1931 xy chromaticity diagram, and a maximum distance (e.g., CSmax) between the first and third points as the angle θ' varies from about zero degrees to about 70 degrees is less than about 0.06.

Figure 14:
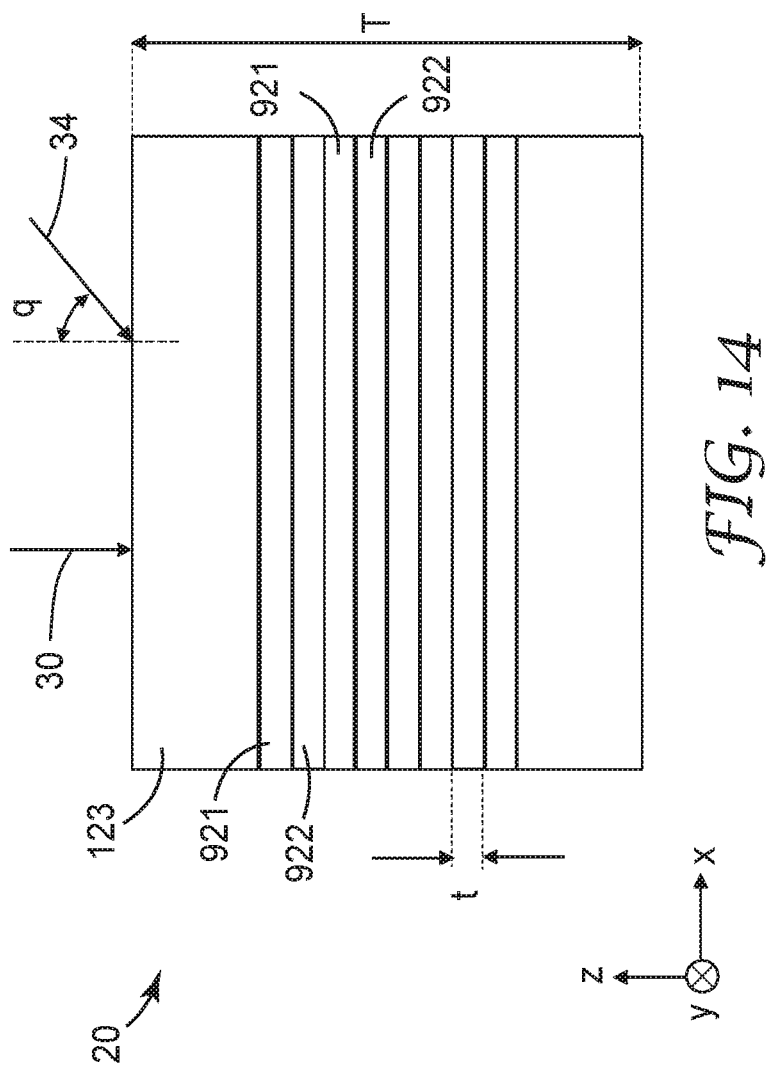
FIG. 14 is a schematic cross-sectional view of a reflective polarizer.

The reflective polarizer 20 can be a multilayer polymeric reflective polarizer. Multilayer polymeric reflective polarizers are known in the art and are described in U.S. Pat. No. 5,882,774 (Jonza et al.); U.S. Pat. No. 6,179,948 (Merrill et al.); U.S. Pat. No. 6,783,349 (Neavin et al.); U.S. Pat. No. 6,967,778 (Wheatley et al.); and U.S. Pat. No. 9,162,406 (Neavin et al.), for example. FIG. 14 is a schematic cross-sectional view of a reflective polarizer 20 according to some embodiments. The reflective polarizer 20 can include a plurality of alternating polymeric first (921) and second (922) layers. The thicknesses profile (different thicknesses of the different layers) of the first and second layers can be selected to provide desired reflection band(s), as is known in the art. In some embodiments, the reflective polarizer 20 has an average thickness T (unweighted mean thickness over an entire area of the reflective polarizer) less than about 30 micrometers, or less than about 20 micrometers. In some embodiments, the plurality of alternating polymeric first and second layers number at least 30 in total (e.g., 50 to 300 layers), and an average thickness t of each first and second layer is less than about 500 nm, or less than about 400 nm, or less than about 300 nm. In some embodiments, the reflective polarizer 20 further includes skin layer(s) 123 at outermost major surface(s) of the reflective polarizer 20. The skin layer(s) 123 can have a thickness greater than about 1 micrometer (e.g., 2 to 20 micrometers), for example. In some embodiments, the reflective polarizer 20 can further include protective boundary layer(s) disposed between packets of alternating first and second layers. A substantially normally incident light 30 and a light 34 incident on the reflective polarizer at an angle of incidence θ are schematically illustrated.

In some embodiments, the reflective polarizer 20 has a reflection spectrum (21) including substantially distinct blue (21b), green (21g), and infrared (21r) reflection bands, such that for substantially normally incident light (30): the infrared reflection band includes at least one wavelength less than about 750 nm; the reflective polarizer 20 reflects at least about 70% of the incident light 30 for at least one wavelength within each of the blue, green, and infrared reflection bands for a first polarization state (e.g., x-axis); the reflective polarizer transmits at least about 70% of the incident light for the at least one wavelength within each of the blue, green, and infrared reflection bands for an orthogonal second polarization state (e.g., y-axis); the reflective polarizer transmits at least about 50% of the incident light for at least one wavelength between the blue and green reflection bands and for at least one wavelength between the green and infrared reflection bands for each of the first and second polarization states. The at least one wavelength within each of the blue, green, and infrared reflection bands can include the wavelengths 14b, 14g and 700 nm, respectively, for example. In some embodiments, for substantially normally incident light 30, a red wavelength range (e.g., corresponding to W1) at least about 30 nm wide is disposed between the green and infrared reflection bands where the reflective polarizer has an average transmittance in the red wavelength range of at least about 50% for each of the first and second polarization states (see, e.g., FIG. 6A and FIG. 7). The red wavelength range can be W1 or can be a wavelength range centered on the peak wavelength 14r and having a width of about 30 to about 50 nm, for example. In some embodiments, for at least one incident angle θ in a range of about 40 degrees to about 70 degrees, the reflective polarizer has an average reflectance in the red wavelength range of at least about 70% for the first polarization state (see, e.g., FIG. 6B and FIG. 7).

In some embodiments, the reflective polarizer 20 has a reflection spectrum (21) including substantially distinct blue (21b), green (21g), and infrared (21r) reflection bands, such that for substantially normally incident light (30): the reflective polarizer 20 reflects at least about 70% of the incident light 30 for at least one wavelength within each of the blue, green, and infrared reflection bands for a first polarization state (e.g., x-axis); the reflective polarizer 20 transmits at least about 70% of the incident light 30 for the at least one wavelength within each of the blue, green, and infrared reflection bands for an orthogonal second polarization state (y-axis); and the reflective polarizer transmits at least about 50% of the incident light for at least one wavelength between the blue and green reflection bands for each of the first and second polarization states. In some embodiments, the infrared reflection band 21r has a FWHM (e.g., W2r) such that for a red wavelength range (e.g., W1r) at least about 30 nm wide: for substantially normally incident light, there is no overlap between the FWHM and the red wavelength range; and for at least one incident angle θ in a range of about 40 degrees to about 70 degrees, substantially the entire red wavelength range overlaps the FWHM.

In some embodiments, the infrared reflection band 21r extends at least from about 690 nm to about 720 nm. The infrared reflection band may include a range of red wavelengths as well as infrared wavelengths and may also be referred to as a red reflection band in such cases.

In some embodiments, the reflective polarizer 20 is such that for a blue wavelength range (e.g., W1b, or a range centered on 14b or centered on a wavelength in a range of about 430 nm to about 480 nm), a green wavelength range (e.g., W1g, or a range centered on 14g or centered on a wavelength in a range of about 520 nm to about 570 nm), and a red wavelength range (e.g., W1r, or a range centered on 14r or centered on a wavelength in a range of about 600 nm to about 650 nm), each of the blue, green and red wavelength ranges being at least about 30 nm wide, and for substantially normally incident light (30): the reflective polarizer 20 has average reflectances Rb, Rg and Rr in the respective blue, green and red wavelength ranges for a first polarization state (e.g., x-axis), Rb being at least about 70%, Rg being less than Rb, Rr being less than Rg and less than about 50%; and an average transmittance of greater than about 60% in each of the blue, green and red wavelength ranges for an orthogonal second polarization state (e.g., y-axis). In some embodiments, the reflective polarizer 20 has a reflection spectrum including an infrared reflection band 21r such that for at least one incident angle θ in a range of about 40 degrees to about 70 degrees, the reflective polarizer has an average reflectance in the red wavelength range of at least about 70% for the first polarization state. In some embodiments, the blue wavelength range is from about 430 nm to about 480 nm, the green wavelength range is from about 520 nm to about 570 nm, and the red wavelength range is from about 600 nm about 650 nm.

In some embodiments, an optical stack 301 includes the reflective polarizer 20 disposed on a retarder layer 40 (see, e.g., FIG. 1). In some embodiments, the retarder layer 40 has a smaller deviation from being a quarter-wave retarder for at least one wavelength in the blue wavelength range than for at least one wavelength in the red wavelength range (see, e.g., FIG. 9). In some embodiments, the optical stack 301 further includes an absorbing polarizer 50 disposed on the reflective polarizer 20 opposite the retarder layer 40, such that for substantially normally incident light 30 having the first polarization state, the absorbing polarizer 50 absorbs at least 60% of the incident light for at least one wavelength in each of the blue, green and red wavelength ranges, and has average transmittances Tb, Tg and Tr for wavelengths in the respective blue, green and red wavelength ranges (see, e.g., FIG. 10). In some embodiments, Tr>Tb and Tg.

In some embodiments, an emissive display 10 includes a plurality of at least blue (11b), green (11g) and red (11r) light emitting pixels having emission peaks with respective blue (W1b), green (W1g) and red (W1r) full width at half maxima (FWHMs), where the reflective polarizer 20 is disposed on the emissive display, and where the blue, green and red wavelength ranges are wavelength ranges of the respective blue (W1b), green (W1g) and red (W1r) FWHMs.

EXAMPLE

Example 1

A computational model was used to calculate reflection and transmission properties of a reflective polarizer. The computational model was driven by a 4×4 matrix solver routine based on the Berriman algorithm where the reflection and transmission matrix elements can be computed for an arbitrary stack of 1-dimensional layers, with each layer defined by its physical thickness and the by a dispersive refractive index tensor where each principal element of the refractive index tensor is a function of wavelength (λ). With this computational model, a 1-dimensional stack structure that represents an emissive display system was defined and its reflection and transmission properties was computed.

A coordinate system for the computational model was defined, with a cartesian set of axes, x, y and z, shown in FIG. 1, where the x axis was as the "block axis", coincident with the high extinction axis of any absorbing polarizer and with the high-reflection axis of any reflective polarizer, and the y-axis was the "pass axis", coincident with the weakly absorbing, high transmission axis of the absorbing polarizer and the weakly reflecting axis of any reflective polarizer. The azimuthal angle $\varphi$ was measured from the x-axis and the polar angle $\theta$ was measured from the z-axis.

With this computational stack model, the viewer-side reflection characteristics of an Organic LED (OLED) display was modelled with a stack structure of a glass layer (the exterior surface of the display) overtop a circular polarizer, composed of a display-quality iodine-type absorbing polarizer, overlaying a quarter-wave ($\lambda/4$) retarder, where the retarder had an extraordinary axis that lied midway between the principal in-plane axes of the absorbing polarizer, and was chosen to be a green wavelength. Further, underneath the retarder layer, was a dielectric layer, representing the thin-film encapsulant (TFE) which in turn overlaid an OLED emission surface including spatially organized array of voltage-driven blue, green and red emission "pixels" areas, surrounded by metallic-like transistor elements and conducting elements that function as the drivers for the emissive pixels that form the display.

Computation was performed with input from the computational stack model, to predict the degree of brightness increase of the intensity of the blue, green and red pixel emitted light from an OLED emission surface. These predictions were based on analysis of the stack-model-computed reflection and transmission coefficient spectra, coupled with an understanding of the reflection spectrum of the OLED emission surface. Analytic expressions were derived to predict pixel emission color and brightness change that results when a reflective polarizer is included in the circular polarizer of a modelled OLED display stack.

A multilayer optical film reflective polarizer was modeled that included optical repeat units (ORUs) which were modeled as being composed of alternating microlayers of 90/10 coPEN and low refractive index isotropic microlayers. The isotropic layers were modeled as being made as follows. A blend of polycarbonate and copolyesters (PCTg) is made as described in U.S. Pat. No. 10,185,068 (Johnson et al.) such that the index is about 1.57 and such that the layers remains substantially isotropic upon uniaxial orientation of the film. The PC:PCTg molar ratio is approximately 85 mol % PC and 15 mol % PCTg. The PC:PCTg is then blended with PETg at an 85:15 weight ratio ((PC:PCTg):PETg). The high index material, 90/10 coPEN, is referred to as material A, and the low index material is referred to as material B.

Figure 15:
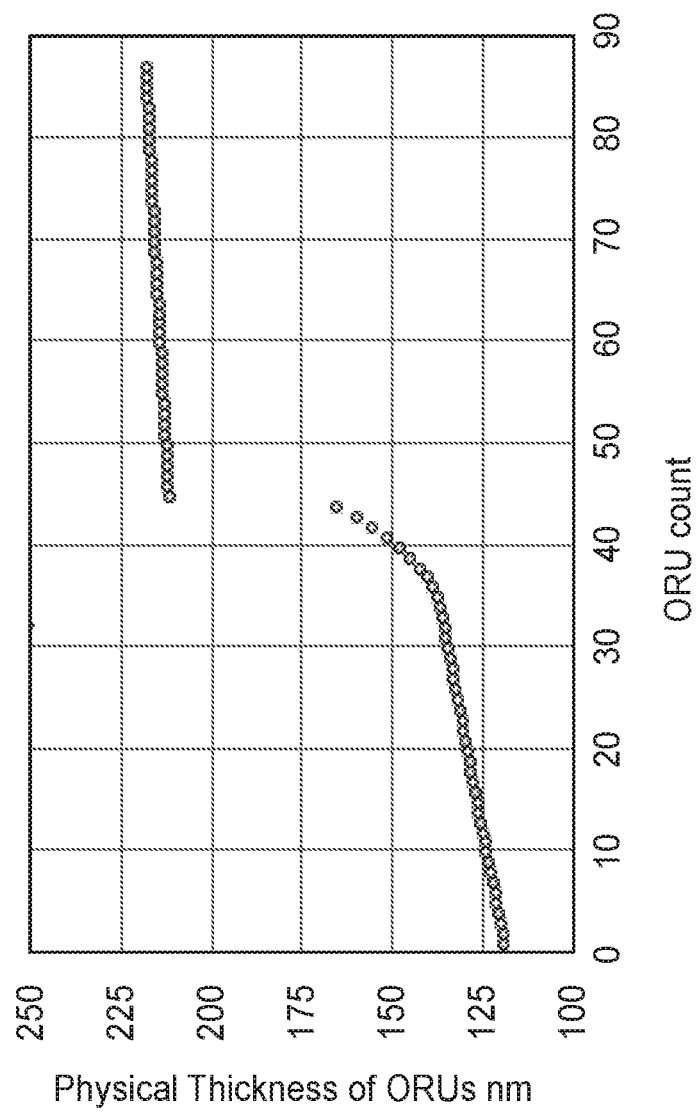
FIG. 15 is a plot of the thickness profile of optical repeat units.

A thickness profile of microlayer A and B pairs, or ORUs, was mathematically generated. The physical thickness profile for ORUs is shown in FIG. 15. The ORU thickness profile was bounded on both sides by a protective boundary layer of the low index material with a thickness of 1500 nm.

Representative values of the refractive index for the high index optical (HIO) layers (the birefringent 90/10 coPEN), denoted Nx, Ny, Nz along the x, y, z axes, respectively, and for the isotropic low index optical (LIO) layers (Niso is used to denote isotropic refractive indices) are shown in the following table:

| | HIO | | | LIO |
|---|---|---|---|---|
| $\lambda$ | Nx | Ny | Nz | Niso |
| 450 nm | 1.9222 | 1.6087 | 1.5987 | 1.5962 |
| 530 nm | 1.8611 | 1.5794 | 1.5696 | 1.5801 |
| 630 nm | 1.8266 | 1.5651 | 1.5554 | 1.5701 |

Further, the model set-up defined a 400 micrometer glass layer followed by a display absorbing polarizer above the multilayer optical film reflective polarizer. The refractive indices for glass and the dielectric layer immediately above the OLED emission surface are shown in the following table.

| $\lambda$ | Glass Niso | Dielectric Niso |
|---|---|---|
| 450 nm | 1.5252 | 1.5057 |
| 530 nm | 1.5195 | 1.4987 |
| 630 nm | 1.5151 | 1.4937 |

The absorbing polarizer was modelled after a Sanritz display polarizer and assumed to be 10 micrometers thick. The refractive index (Niso) and the loss (Kx, Ky, Kz) for the absorbing polarizer are shown in the following table.

| | Absorbing Polarizer | | | |
|---|---|---|---|---|
| $\lambda$ | Niso | Kx | Ky | Kz |
| 450 nm | 1.5043 | 3.527E−02 | 7.367E−04 | 7.367E−04 |
| 530 nm | 1.4983 | 4.387E−02 | 4.732E−04 | 4.732E−04 |
| 630 nm | 1.4953 | 5.242E−02 | 5.084E−04 | 5.084E−04 |

In the model, a quarter-wave retarder layer was situated below the reflective polarizer, with its extraordinary axis aligned midway at 45 degrees between the x-axis and the y-axis. The refractive index values for the retarder for the extraordinary (Ne) and ordinary (No) axes are shown in the following table, as are the deviation values $\Delta$ (in nanometers) from quarter-wave, at the representative wavelengths. These retarder properties were manipulated in the model by changing the retarder thickness.

| | Retarder | | | |
|---|---|---|---|---|
| $\lambda$ | Ne | No | No | $\Delta$ |
| 450 nm | 1.5043 | 1.4903 | 1.4903 | 24.13 |
| 530 nm | 1.4983 | 1.4843 | 1.4843 | 4.48 |
| 630 nm | 1.4953 | 1.4813 | 1.4813 | 21.37 |

The OLED emission surface was defined in the model as having metal-like phase rotation properties upon reflection and with reflection coefficient values shown in the following table.

| $\lambda$ | Refl. coef. |
|---|---|
| 450 nm | 0.3336 |
| 530 nm | 0.4895 |
| 630 nm | 0.5570 |

The absorption coefficients for all of the layers in the OLED model, except for the absorbing polarizer, were taken to be insignificantly small.

Figure 16:
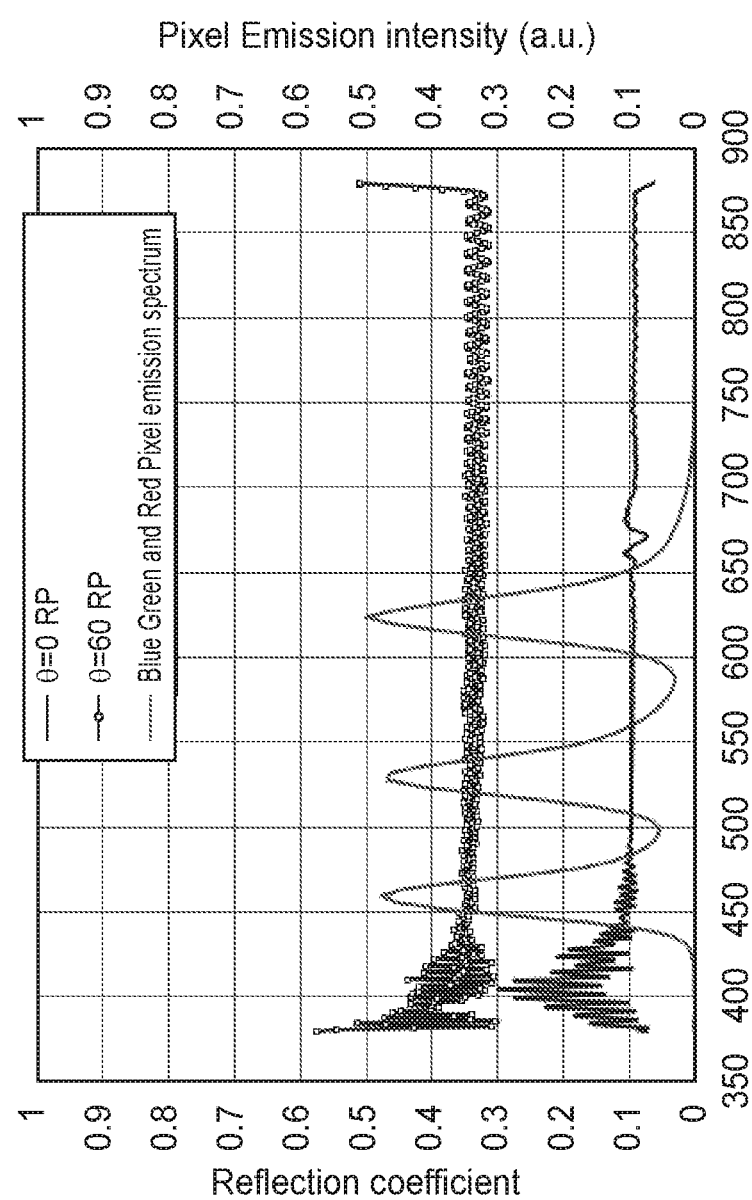
FIG. 16 is a plot of the reflectance of a reflective polarizer for a pass polarization state.

FIG. 8 shows the computed reflection coefficient (fraction of incident energy that is reflected) for the multilayer optical film reflective polarizer, when it was configured in air, for electric field aligned with the x-axis, for polar angles of 0 degrees and 60 degrees. FIG. 16 shows the computed reflection coefficient for the multilayer optical film reflective polarizer, when it was configured in air, for electric field aligned with the y-axis, for polar angles of 0 degrees and 60 degrees.

Figure 17:
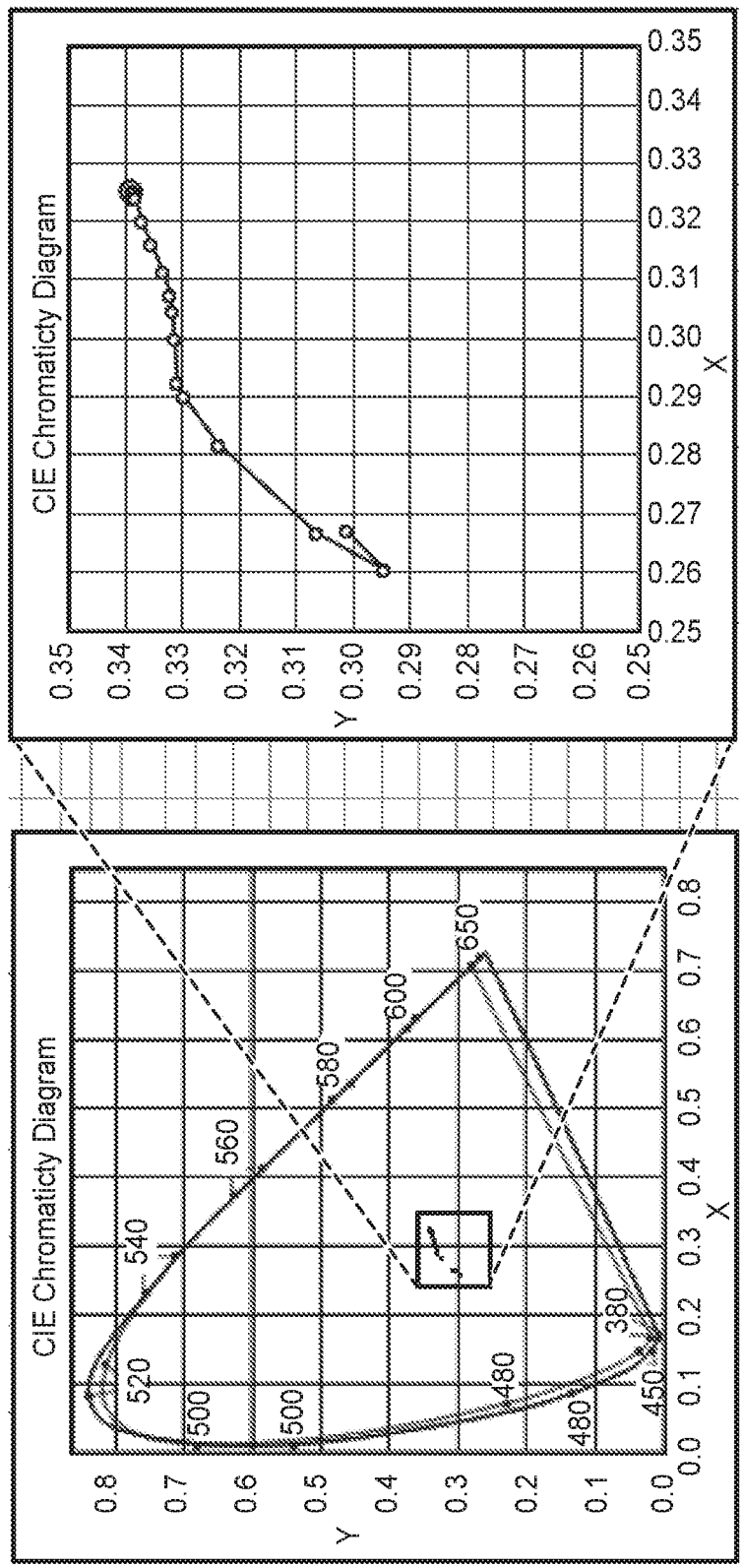
FIG. 17 is a CIE 1931 xy chromaticity diagrams showing a white point color shift with viewing angle for a display without a reflective polarizer.
Figure 18:
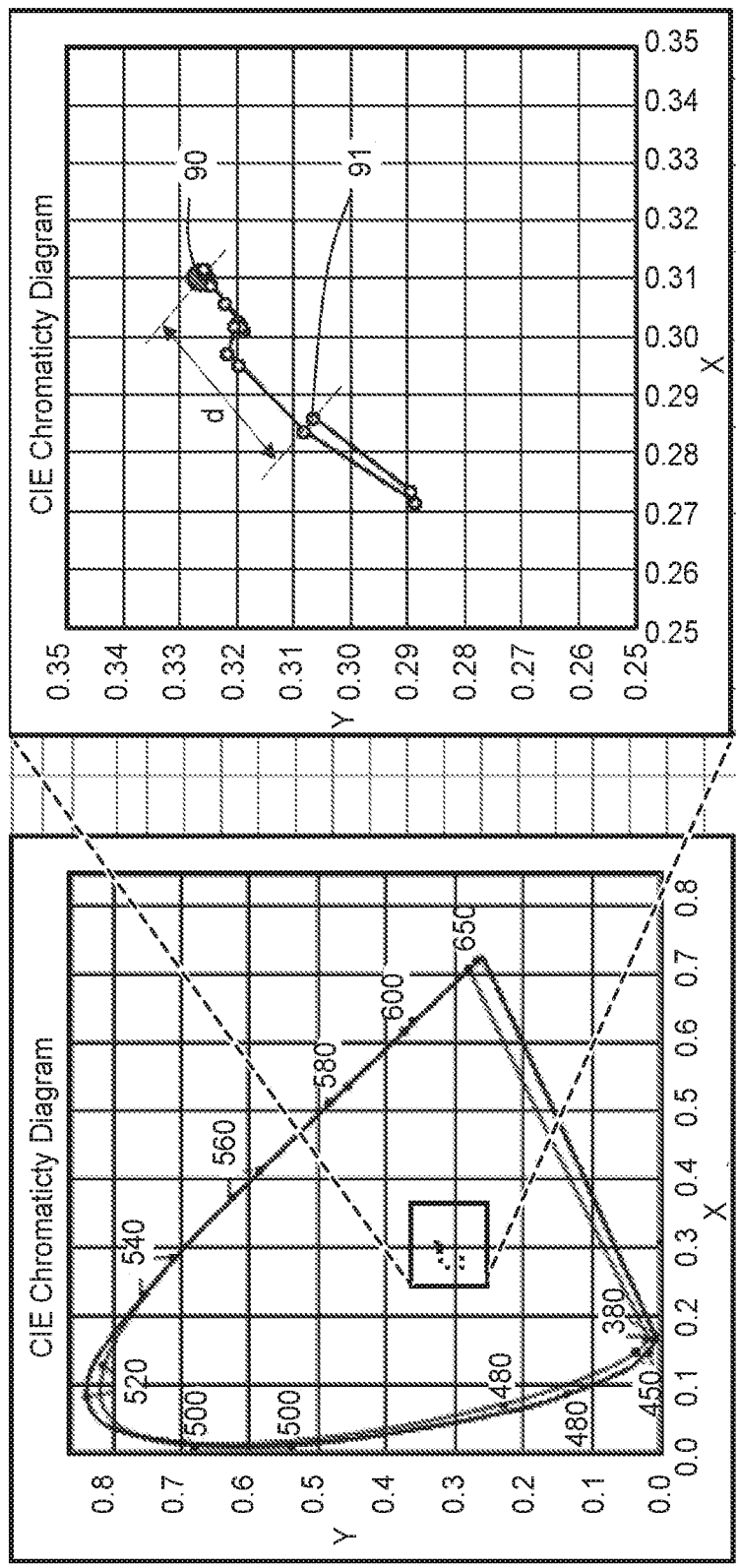
FIG. 18 is a CIE 1931 xy chromaticity diagrams showing a white point color shift with viewing angle for a display with a reflective polarizer.
Figure 19:
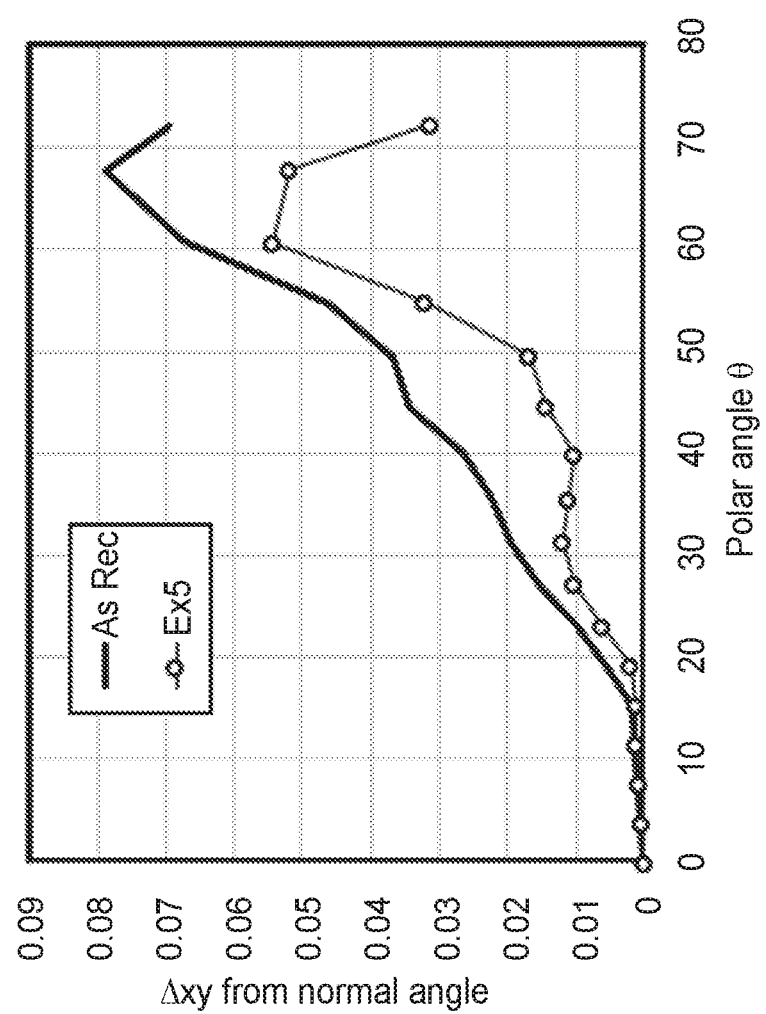
FIG. 19 is a plot of the chromaticity distance from color coordinates at normal incidence as the view angle varies.
Figure 20:
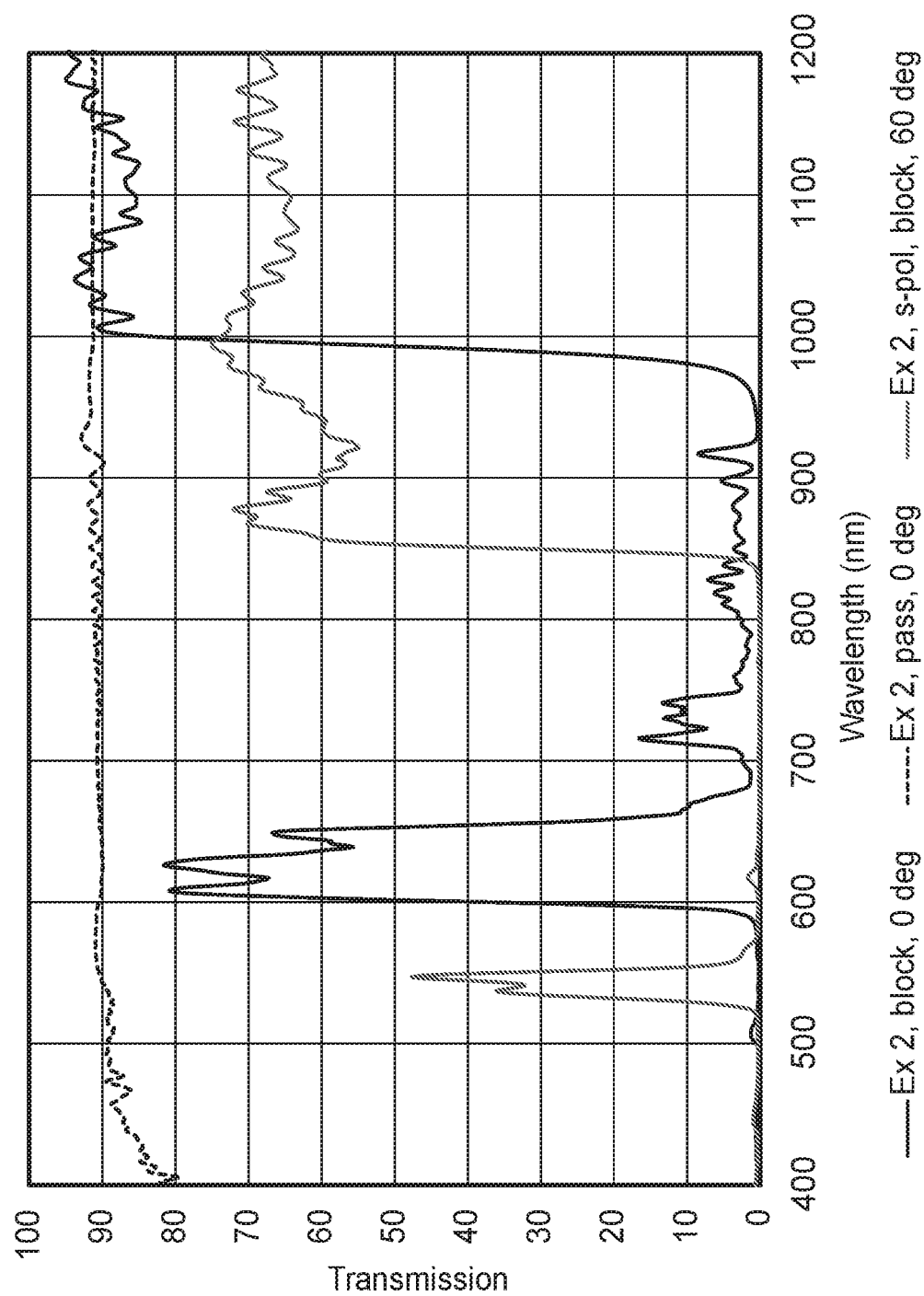
FIGS. 20-26 are plots of percent transmission versus wavelength for various reflective polarizers.
Figure 21:
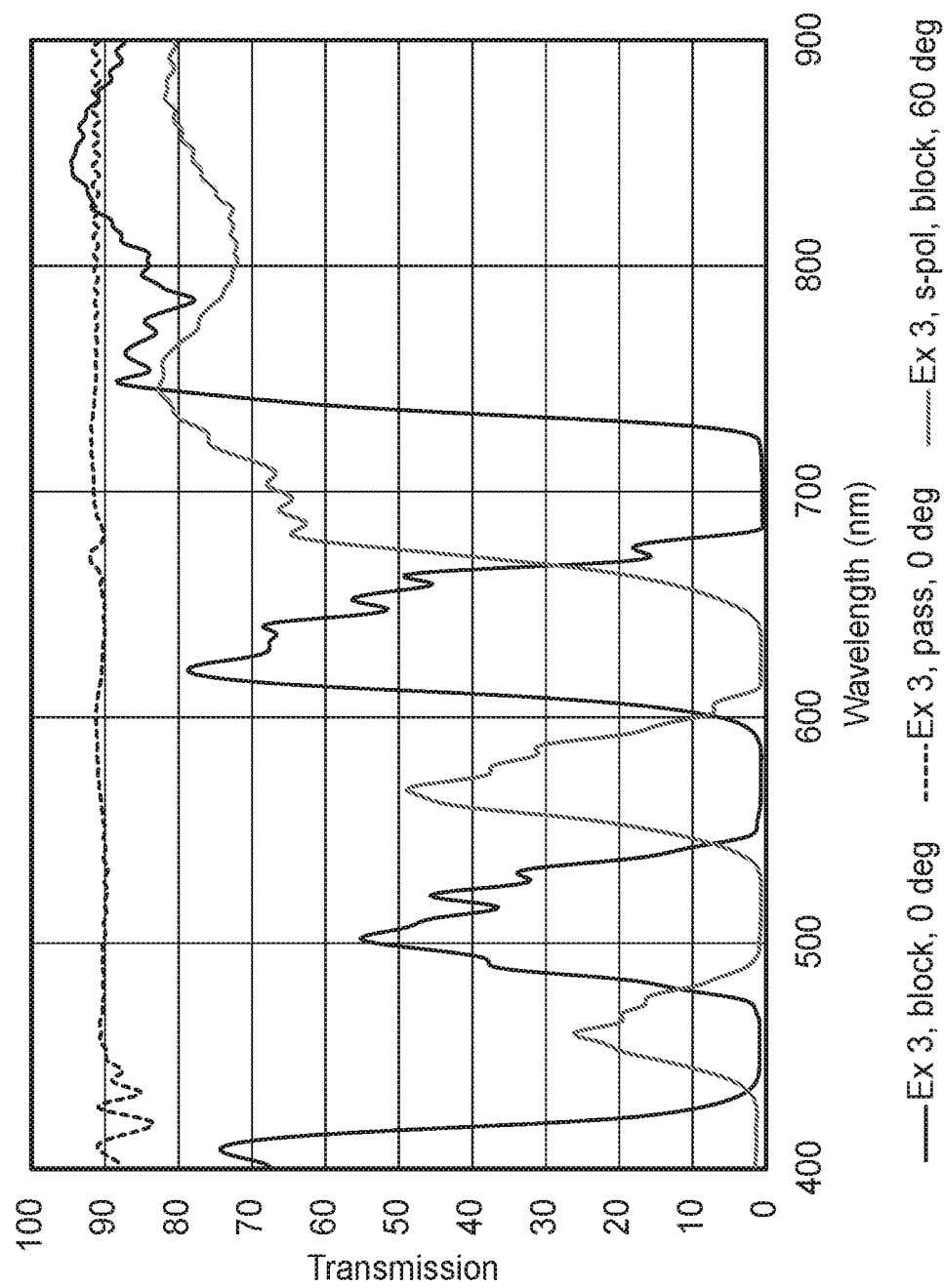
Figure 22:
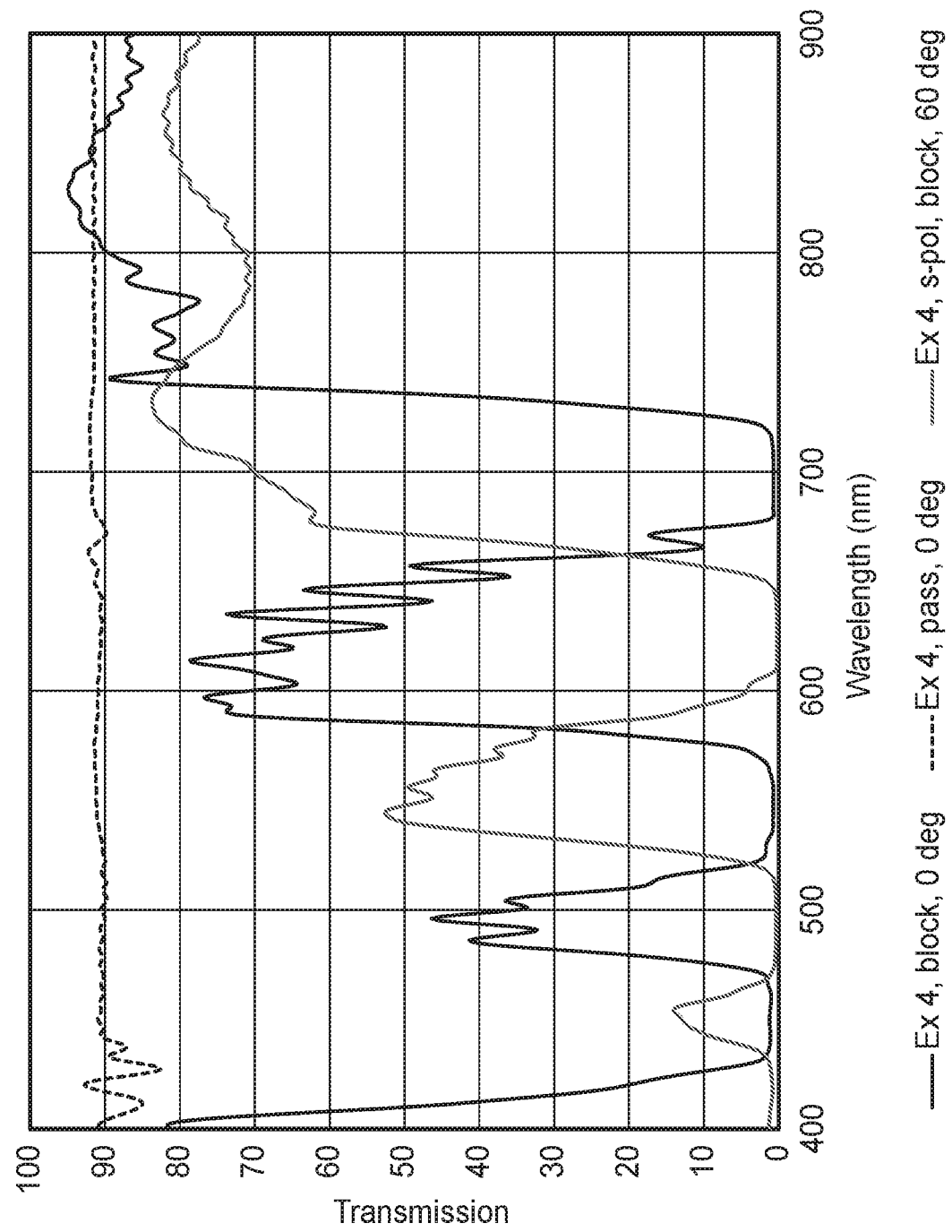
Figure 23:
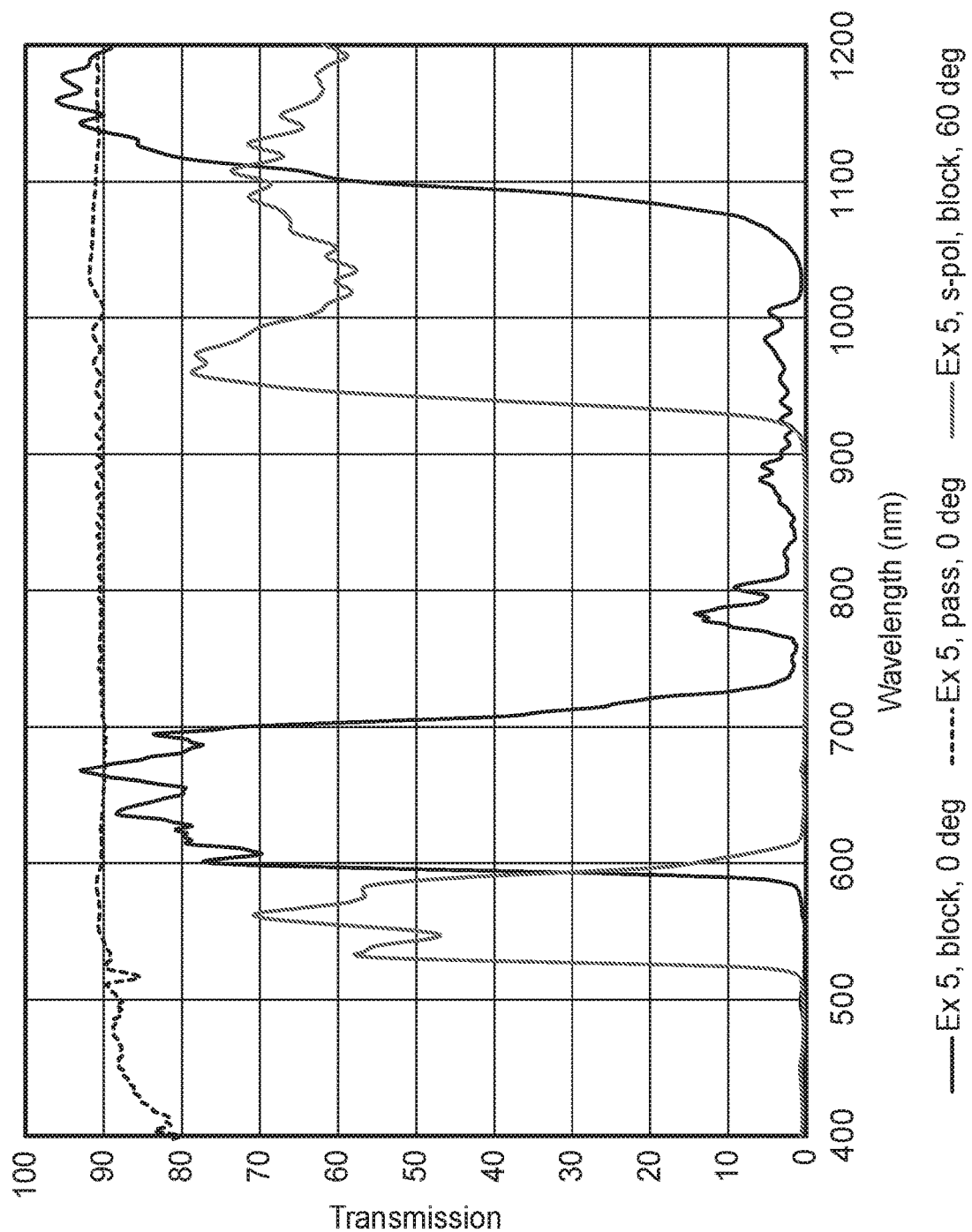
Figure 24:
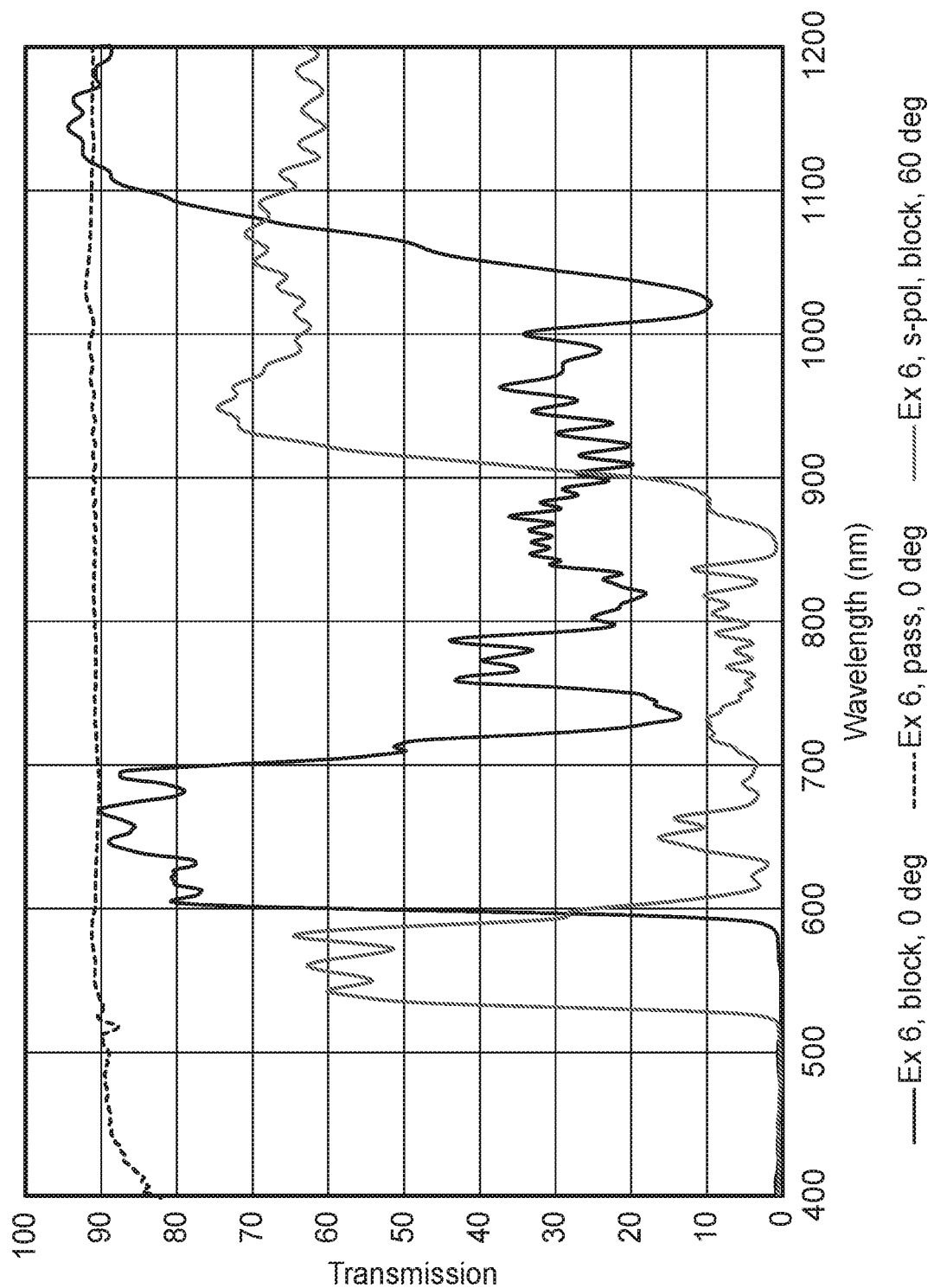
Figure 25:
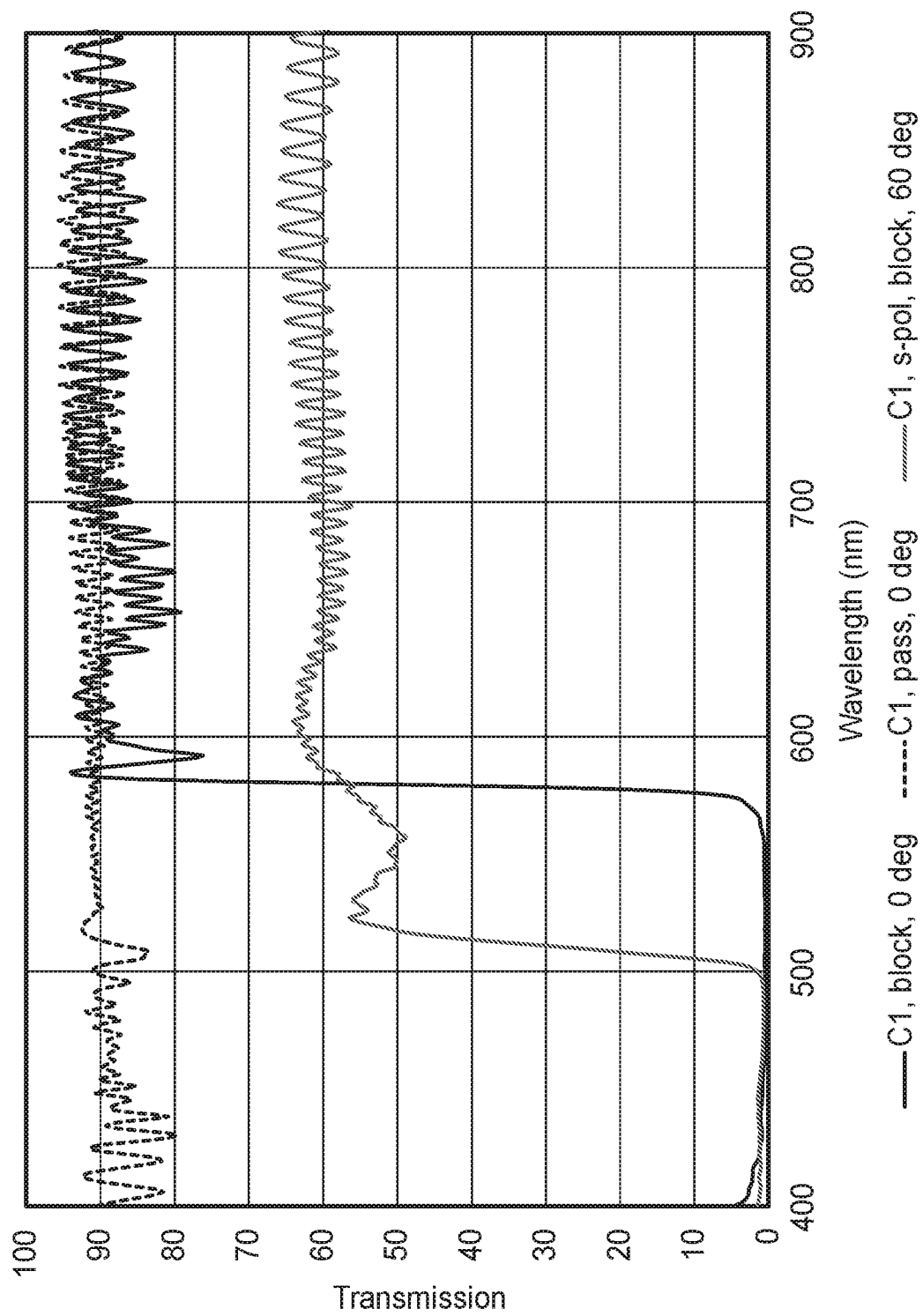
Figure 26:
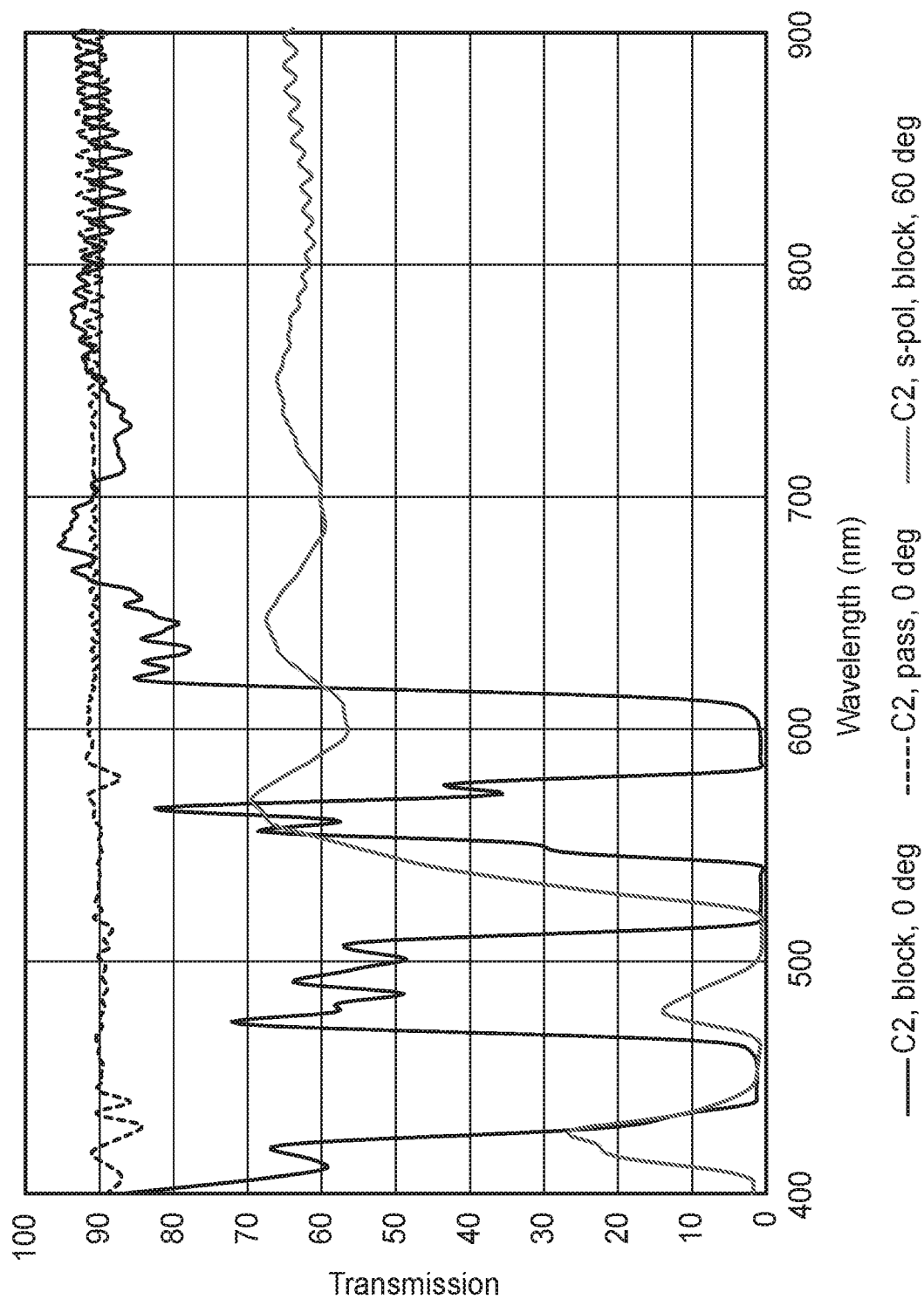

Computation was performed with input from the computational stack model to predict the degree of brightness increase of the intensity of the blue, green and red pixel emitted light from an OLED emission surface. These predictions were based on analysis of the stack-model-computed reflection and transmission coefficient spectra coupled with understanding of the reflection spectrum of the OLED emission surface which were based on measurements of a commercial LG V30 OLED smart phone in this Example. Analytic expressions were derived to predict pixel emission color and brightness change that resulted when a reflective polarizer was included in the circular polarizer of a modelled OLED display stack. This computational model is referred to as a Polarization Coherent Recycling Model (PCRM). In this example, PCRM analysis of the OLED with the Reflective Polarizer described in FIGS. 8, 15, and 16 as part of the circular polarizer, was performed separately for each of the blue, green and red emission inputs. FIG. 17 shows the OLED white point color on a CIE 1931 xy chromaticity diagram as the polar angle varies from 0 degrees to 72.5 degrees for the display without the reflective polarizer. FIG. 18 shows the corresponding white point CIE 1931 xy color coordinates as the polar angle varies from zero degrees (point 90) to 72.5 degrees (point 91) when the reflective polarizer is included in the circular polarizer stack between the absorbing polarizer and the retarder layer. The distance between points 90 and 91 is denoted d. FIG. 19 is a plot of the distance (d) on a CIE 1931 xy diagram from the color coordinates at normal incidence (θ=0) as the view angle θ varies for the display with (Ex. 1) and without (No RP) the reflective polarizer.

In addition to the white state chromaticity coordinates, the photopic brightness increase was calculated for the OLED display incorporating the reflective polarizer for each of the OLED color pixels relative to their photopic brightness without the reflective polarizer. FIG. 12 shows the photopic brightness increase for each of the blue, green and red pixels alone, and for the white output generated by all of the blue, green and red pixels emitting simultaneously.

Examples 2-6 and Comparative Examples C1-C2

Reflective polarizer films were prepared as follows: one (Examples 3-4 and Comparative Examples C1-C2) or two (Examples 2 and 5-6) multilayer optical packets were co-extruded. Each packet contained alternating layers of 90/10 coPEN, a polymer composed of 90% polyethylene naphthalate (PEN) and 10% polyethylene terephthalate (PET), and a low index isotropic layer, which was made with a blend of polycarbonate and copolyesters (PC:coPET) such that the index was about 1.57 and such that the isotropic layer remained substantially isotropic upon uniaxial orientation of the film. The PC:coPET molar ratio was approximately 42.5 mol % PC and 57.5 mol % coPET and had a Tg of 105 degrees centigrade. This isotropic material was chosen such that after stretching its refractive indices in the two non-stretch directions remained substantially matched with those of the birefringent material in the non-stretching direction while in the stretching direction there was a substantial mis-match in refractive indices between birefringent and non-birefringent layers. The 90/10 PEN and PC:coPET polymers were fed from separate extruders at a target f-ratio (ratio of optical thickness of high index layer to optical thickness of optical repeat unit) as indicated in the table below (for two packet films, the f-ratio for each of the two packets P1, P2 is given) to a multilayer coextrusion feedblock, in which they were assembled into packet(s) of alternating optical layers, plus a thicker protective boundary layer of the PC:coPET, on each side. The multilayer melt was then cast through a film die onto a chill roll, in the conventional manner for polyester films, upon which it was quenched. The cast web was then stretched in a parabolic tenter similar to that described in the Invited Paper 45.1, authored by Denker et al., entitled "Advanced Polarizer Film for Improved Performance of Liquid Crystal Displays," presented at Society for Information Displays (SID) International Conference in San Francisco, Calif., Jun. 4-9, 2006. The number of layers and the layer thickness profile was selected to produce a desired transmission spectrum as shown in FIGS. 20-26 which shows the percent transmission in the pass and block states at normal incidence (0 deg) and transmission for s-polarized light in the block state at an angle of incidence of 60 degrees.

| Example | Thickness (micrometers) | f-ratio | Number of layers |
|---|---|---|---|
| C1 | 20.41 | 0.5 | 275 |
| C2 | 23.67 | 0.24 | 275 |
| 2 | 58.14 | 0.5 P1, 0.30 P2 | 550 |
| 3 | 28.52 | 0.33 | 275 |
| 4 | 27.84 | 0.33 | 275 |
| 5 | 60.15 | 0.5 P1, 0.30 P2 | 550 |
| 6 | 60.68 | 0.5 P1, 0.15 P2 | 550 |

Figure 27:
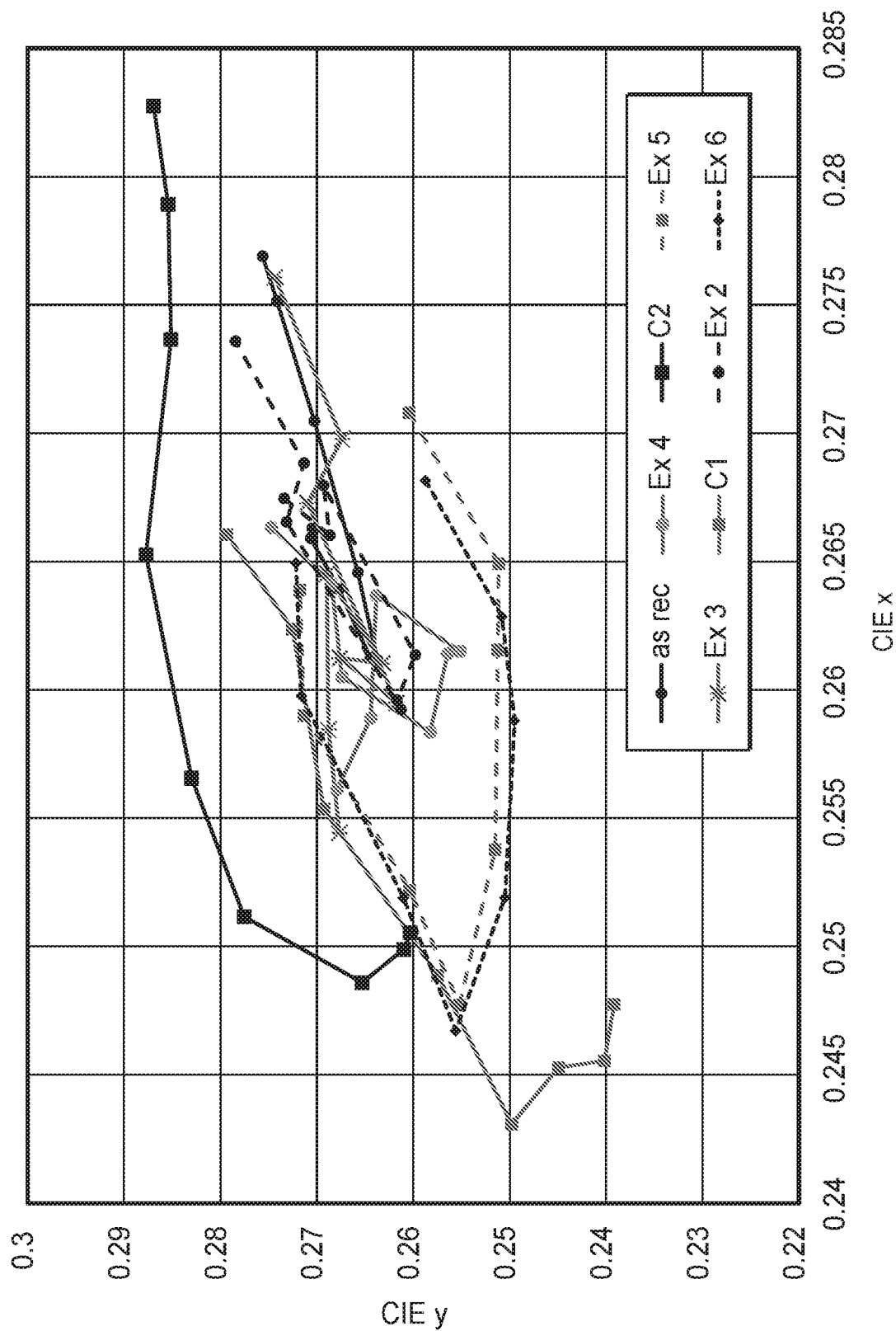
FIG. 27 is a plot showing white point color shift as a function of view angle on a CIE 1931 xy chromaticity diagram for OLED TV displays.
Figure 28:
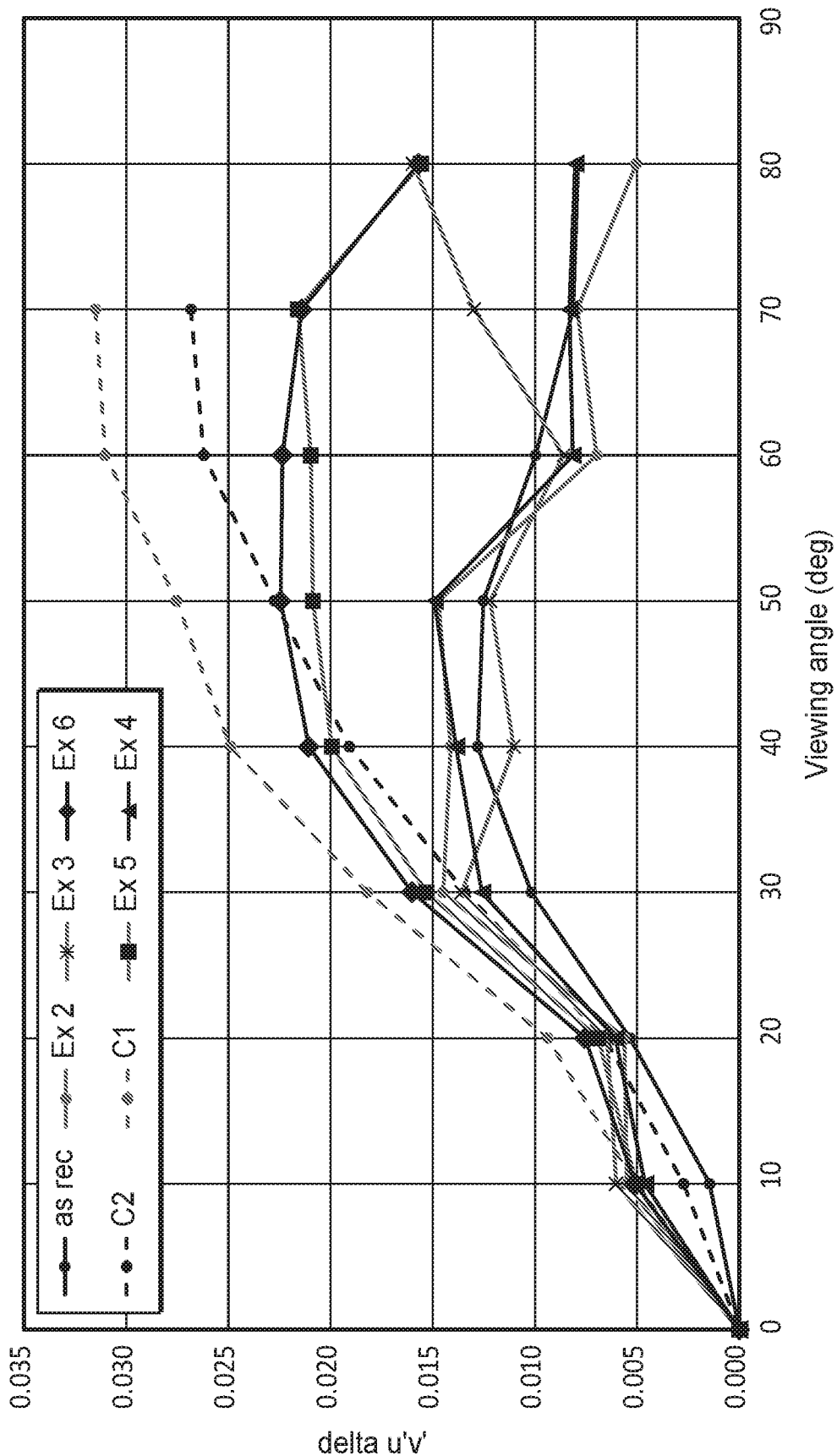
FIG. 28 is a plot showing white point color shift as a function of view angle on a CIE 1976 Uniform Chromaticity Scale u'v' diagram for OLED TV displays.
Figure 29:
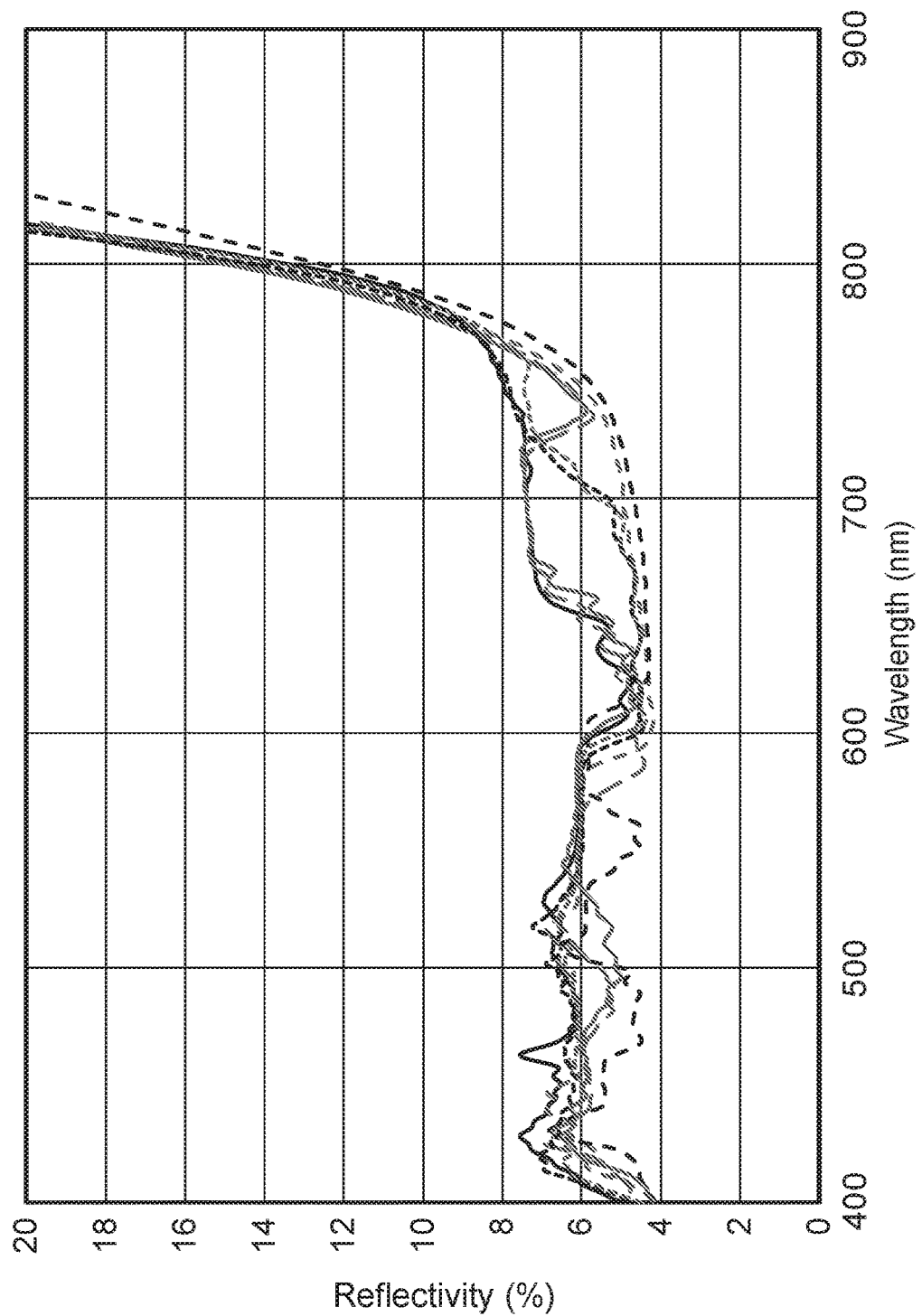
FIG. 29 is a plot of the ambient reflection from OLED displays.

FIG. 27 is a plot of white point color shift as the view angle varies from zero to 80 degrees in 10 degree increments in CIE 1931 xy coordinates for an LG OLED TV without a reflective polarizer ("as rec") and with the reflective polarizer indicated in the figure disposed between the absorbing polarizer and the retarder layer of the circular polarizer of the TV. FIG. 28 is a corresponding plot of the shift in white point color defined as a distance on a CIE 1976 Uniform Chromaticity Scale u'v' diagram. FIG. 29 is a plot of the ambient reflection from the display for an angle of incidence of 8 degrees.

Figure 30:
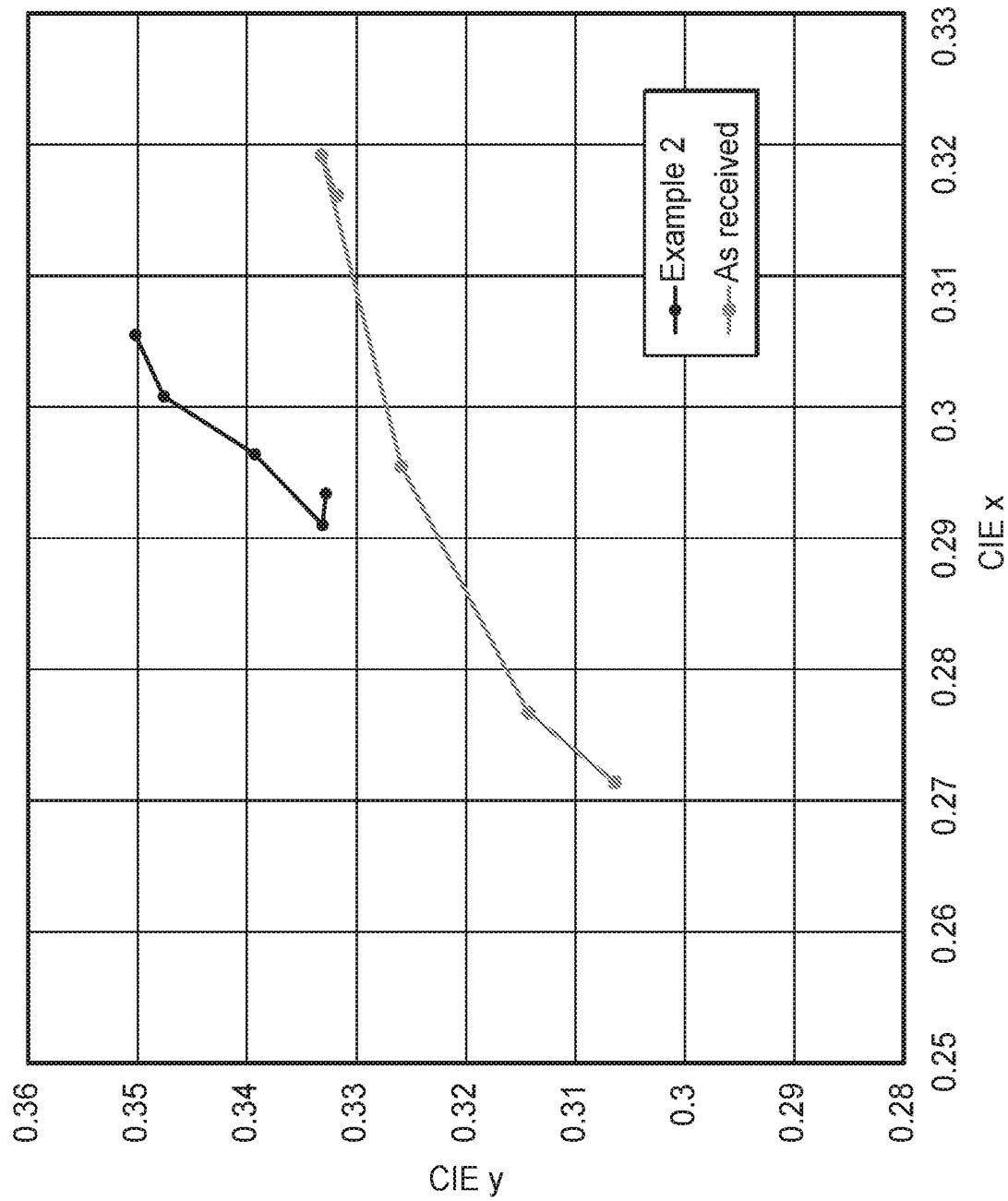
FIG. 30 is a plot showing white point color shift as a function of view angle on a CIE 1931 xy chromaticity diagram for OLED phone displays.
Figure 31:
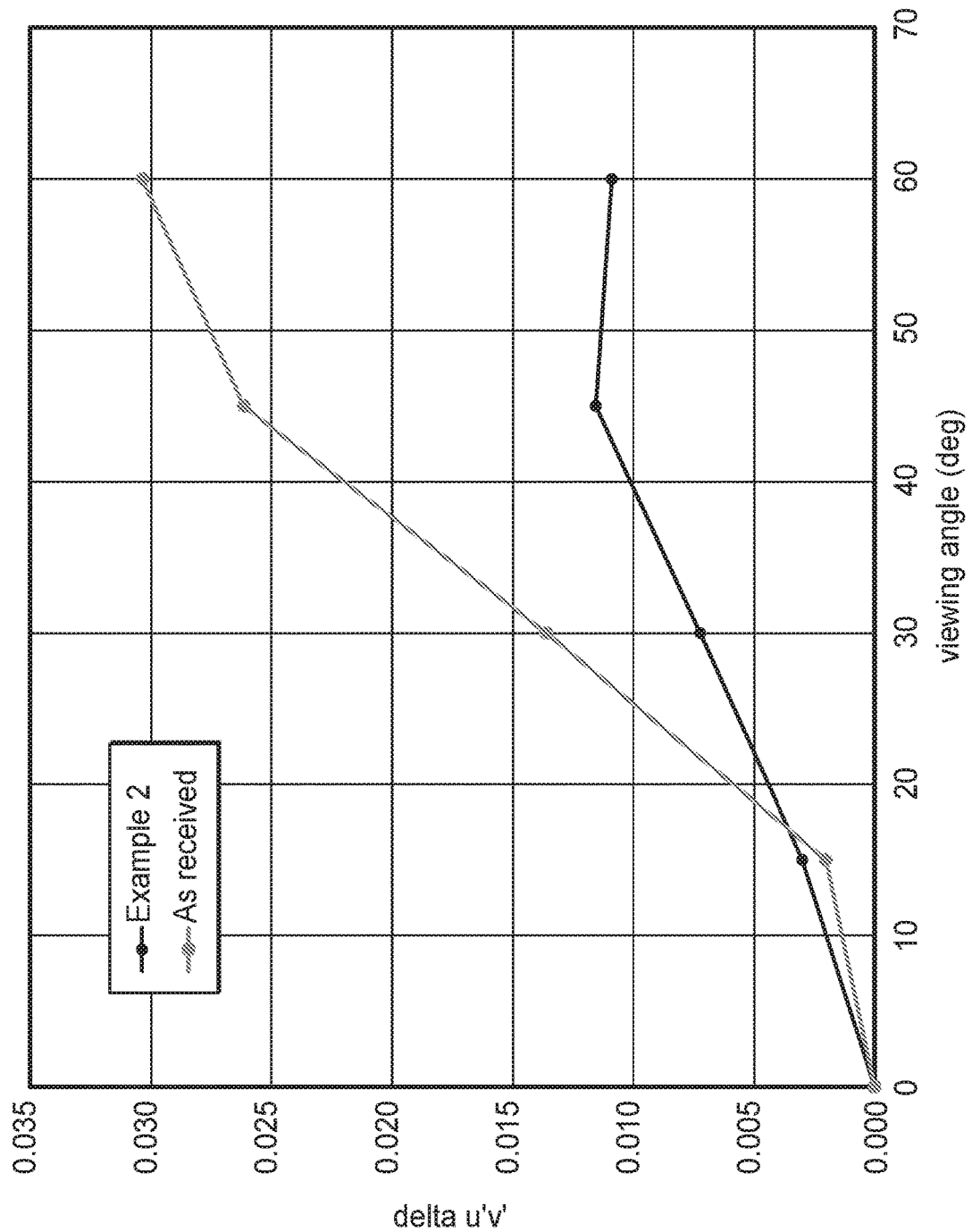
FIG. 31 is a plot showing white point color shift as a function of view angle on a CIE 1976 Uniform Chromaticity Scale u'v' diagram for OLED phone displays.

FIG. 30 is a plot of white point color shift as the view angle varies from zero to 80 degrees in 10 degree increments in CIE 1931 xy coordinates for an LG V30 OLED phone without a reflective polarizer ("As received") and with the reflective polarizer of Example 2 disposed between the absorbing polarizer and the retarder layer of the circular polarizer of the phone. FIG. 31 is a corresponding plot of the shift in white point color defined as a distance on a CIE 1976 Uniform Chromaticity Scale u'v' diagram.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 5 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.95 and 1.05, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A display system comprising:
   a display panel comprising a plurality of at least blue, green and red light emitting pixels having respective blue, green and red emission spectra comprising respective blue, green and red emission peaks at respective blue, green and red peak wavelengths with respective blue, green and red full width at half maxima (FWHMs); and
   a reflective polarizer disposed on the plurality of the at least blue, green and red light emitting pixels and comprising a reflection spectrum comprising substantially distinct blue, green and red reflection bands with respective blue, green and red FWHMs, such that for substantially normally incident light:
   the reflective polarizer reflects at least about 60% of the incident light for at least one wavelength within each of the FWHMs of the blue, green and red reflection bands for a first polarization state;
   the reflective polarizer transmits at least about 60% of the incident light for the at least one wavelength within each of the FWHMs of the blue, green and red reflection bands for an orthogonal second polarization state;
   the reflective polarizer transmits at least about 30% of the incident light for at least one wavelength between the blue and green FWHMs of the reflective polarizer and at least one wavelength between the green and red FWHMs of the reflective polarizer for each of the first and second polarization states;
   at least about 30% of the FWHMs of the blue and green emission spectra overlap the respective blue and green FWHMs of the reflective polarizer; and
   less than about 20% of the FWHM of the red emission spectrum overlaps the red FWHM of the reflective polarizer.

2. The display system of claim 1, wherein the display panel comprises an organic light emitting diode (OLED) display panel.

3. The display system of claim 1, wherein for the substantially normally incident light, there is no overlap between the red FWHM of the reflective polarizer and the FWHM of the red emission spectrum.

4. The display system of claim 1, wherein for the first polarization state:
   for substantially normally incident light, the reflective polarizer has a smaller reflectance at the red peak wavelength than the green peak wavelength; and
   for at least one incident angle greater than about 40 degrees, the reflective polarizer has a greater reflectance at the red peak wavelength than the green peak wavelength.

5. The display system of claim 1, further comprising an absorbing polarizer disposed on the display panel; and
   a retarder layer disposed between the absorbing polarizer and the display panel; wherein the reflective polarizer is disposed between the absorbing polarizer and the retarder layer, such that the display system has an optical gain $g_0$ along a first direction substantially normal to the display and an optical gain $g_1$ along a second direction making an angle greater than about 60 degrees with the first direction, wherein:
   $g_0$ is greater than $g_1$ for the blue and green peak wavelengths; and
   $g_0$ is less than $g_1$ for the red peak wavelengths.

6. The display system of claim 1, wherein when the display panel emits a substantially white light, a first portion of the emitted substantially white light exits the display system as a first light propagating along a first direction substantially normal to the display panel and a second portion of the emitted substantially white light exits the display system as a second light propagating along a second direction making an angle greater than about 60 degrees with the first direction, wherein the first and second lights correspond to respective first and second points on a CIE 1976 Uniform Chromaticity Scale u'v' diagram, and wherein a distance between the first and second points is less than about 0.023.

7. The display system of claim 1, wherein for substantially normally incident light and wavelengths in the blue, green and red FWHMs, the reflective polarizer has:
   respective average reflectances Rb, Rg and Rr for the first polarization state, Rb>Rg>Rr; and
   an average transmittance of greater than about 60% for wavelengths in each FWHM for an orthogonal second polarization state.

8. The display system of claim 1, further comprising a retarder layer disposed on the display panel and having a smaller deviation from being a quarter-wave retarder at the blue peak wavelength than at the red peak wavelength.

9. The display system of claim 1, wherein for the wavelengths in the red FWHM:
   for substantially normally incident light, the reflective polarizer has an average reflectance of less than about 40% for the first polarization state, and an average reflectance of less than about 20% for the second polarization state; and
   for light incident at at least one incident angle greater than about 50 degrees, the reflective polarizer has an average reflectance of greater than about 60% for the first polarization state.

10. A display system comprising:
    a display panel comprising a plurality of first light emitting pixels having a first emission spectrum comprising a first emission peak at a first peak wavelength with a first full width at half maximum (FWHM); and
    a reflective polarizer disposed on the plurality of first light emitting pixels, such that for the wavelengths in the first FWHM:

for substantially normally incident light, the reflective polarizer has an average reflectance of less than about 40% for a first polarization state, and an average reflectance of less than about 20% for an orthogonal second polarization state; and for light incident at at least one incident angle greater than about 50 degrees, the reflective polarizer has an average reflectance of greater than about 60% for the first polarization state.

11. The display system of claim 10, further comprising a retarder layer disposed between the reflective polarizer and the display panel.

12. The display system of claim 11, further comprising an absorbing polarizer, the reflective polarizer being disposed between the absorbing polarizer and the retarder layer.

13. The display system of claim 10, wherein the display panel further comprises a plurality of second light emitting pixels and a plurality of third light emitting pixels, the first light emitting pixels being red light emitting pixels, the second light emitting pixels being green light emitting pixels, and the third light emitting pixels being blue light emitting pixels.

14. A display system comprising:
an emissive display comprising a plurality of at least blue, green and red light emitting pixels comprising emission peaks at respective blue, green and red peak wavelengths with respective blue, green and red full width at half maxima (FWHMs);
a reflective polarizer disposed on the emissive display, such that for substantially normally incident light and wavelengths in the blue, green and red FWHMs, the reflective polarizer has:
respective average reflectances Rb, Rg and Rr for a first polarization state, Rb>Rg>Rr; and
an average transmittance of greater than about 60% for wavelengths in each FWHM for an orthogonal second polarization state; and
a retarder layer disposed on the emissive display and having a smaller deviation from being a quarter-wave retarder at the blue peak wavelength than at the red peak wavelength.

15. The display system of claim 14 further comprising an absorbing polarizer disposed on the reflective polarizer opposite the retarder layer, such that for substantially normally incident light having the first polarization state, the absorbing polarizer absorbs at least 60% of the incident light for each of the blue, green and red peak wavelengths, and has average transmittances Tb, Tg and Tr for wavelengths in the respective blue, green and red FWHMs, Tr>Tb and Tg.

16. A display system comprising:
a display comprising a plurality of blue, green, and red light emitting pixels;
an absorbing polarizer disposed on the display;
a retarder layer disposed between the absorbing polarizer and the display; and
a reflective polarizer disposed between the absorbing polarizer and the retarder layer, such that the display has an optical gain $g_0$ along a first direction substantially normal to the display and an optical gain $g_1$ along a second direction making an angle $\theta$ greater than about 60 degrees with the first direction, wherein:
$g_0$ is greater than $g_1$ for wavelengths corresponding to peak emissions of the blue and green light emitting pixels; and
$g_0$ is less than $g_1$ for wavelengths corresponding to a peak emission of the red light emitting pixels.

17. The display system of claim 16, wherein for wavelengths corresponding to a peak emission of the red light emitting pixels, the display has a maximum gain along a direction making an angle in a range of 40 to 60 degrees with the first direction.

18. The display system of claim 16, wherein the display further comprises a plurality of white light emitting pixels, and wherein $g_0$ is greater than $g_1$ for a wavelength corresponding to a peak emissions of the white light emitting pixels.

19. The display system of claim 16, wherein when the display panel emits a substantially white light, a first portion of the emitted substantially white light exits the display system as a first light propagating along a first direction substantially normal to the display panel and a second portion of the emitted substantially white light exits the display system as a second light propagating along a second direction making an angle greater than about 60 degrees with the first direction, wherein the first and second lights correspond to respective first and second points on a CIE 1976 Uniform Chromaticity Scale u'v' diagram, and wherein a distance between the first and second points is less than about 0.023.

20. The display system of claim 16, wherein the retarder layer has a smaller deviation from being a quarter-wave retarder for the wavelength corresponding to the peak emission of the blue light emitting pixel than for the wavelength corresponding to the peak emission of the green light emitting pixel.

* * * * *